(12) United States Patent
Jung et al.

(10) Patent No.: US 10,644,158 B2
(45) Date of Patent: May 5, 2020

(54) SEMICONDUCTOR DEVICE INCLUDING FIN FIELD EFFECT TRANSISTOR AND METHOD OF MANUFACTURING THE SAME

(71) Applicant: Samsung Electronics Co., Ltd., Suwon-si, Gyeonggi-do (KR)

(72) Inventors: Su Jin Jung, Hwaseoung-si (KR); Jeong Ho Yoo, Hwaseong-si (KR); Jong Ryeol Yoo, Hwaseong-si (KR); Young Dae Cho, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 0 days.

(21) Appl. No.: 16/162,510

(22) Filed: Oct. 17, 2018

(65) Prior Publication Data

US 2019/0296144 A1 Sep. 26, 2019

(30) Foreign Application Priority Data

Mar. 23, 2018 (KR) .................. 10-2018-0033983

(51) Int. Cl.
| | |
|---|---|
| *H01L 29/08* | (2006.01) |
| *H01L 29/78* | (2006.01) |
| *H01L 29/66* | (2006.01) |
| *H01L 21/768* | (2006.01) |
| *H01L 21/308* | (2006.01) |

(Continued)

(52) U.S. Cl.
CPC ........ *H01L 29/785* (2013.01); *H01L 21/3086* (2013.01); *H01L 21/76831* (2013.01); *H01L 29/0649* (2013.01); *H01L 29/0847* (2013.01); *H01L 29/36* (2013.01); *H01L 29/6656* (2013.01); *H01L 29/66545* (2013.01); *H01L 29/66795* (2013.01)

(58) Field of Classification Search
CPC ... H01L 29/785; H01L 29/0649; H01L 29/36; H01L 21/3086; H01L 21/76831; H01L 29/6656; H01L 29/66545; H01L 29/0847; H01L 29/66795
See application file for complete search history.

(56) References Cited

U.S. PATENT DOCUMENTS

| | | |
|---|---|---|
| 7,135,372 B2 | 11/2006 | Huang et al. |
| 9,105,654 B2 | 8/2015 | Ma et al. |
| 9,293,581 B2 | 3/2016 | Yu et al. |

(Continued)

*Primary Examiner* — Kyoung Lee
(74) *Attorney, Agent, or Firm* — Lee IP Law, PC

(57) ABSTRACT

A semiconductor device and a method of manufacturing a semiconductor device, the device including an active pattern protruding from a substrate; a plurality of gate structures each including a gate electrode and crossing the active pattern; and a source/drain region between the plurality of gate structures, wherein the source/drain region includes a high concentration doped layer in contact with a bottom surface of a recessed region in the active pattern, a first epitaxial layer in contact with an upper surface of the high concentration doped layer and a sidewall of the recessed region, and a second epitaxial layer on the first epitaxial layer, and the high concentration doped layer has a first area in contact with the bottom surface of the recessed region and a second area in contact with the sidewall of the recessed region, the first area being wider than the second area.

19 Claims, 37 Drawing Sheets

(51) Int. Cl.
*H01L 29/36* (2006.01)
*H01L 29/06* (2006.01)

(56) References Cited

U.S. PATENT DOCUMENTS

| | | |
|---|---|---|
| 9,368,628 B2 | 6/2016 | Li et al. |
| 9,397,214 B1 | 7/2016 | Chan et al. |
| 9,412,814 B2 | 8/2016 | Lee et al. |
| 9,608,117 B2 | 3/2017 | Kim et al. |
| 9,627,482 B2 | 4/2017 | Cheng et al. |
| 2016/0087104 A1* | 3/2016 | Lee .................... H01L 29/7851 |
| 2016/0211371 A1 | 7/2016 | Tsai et al. |

* cited by examiner

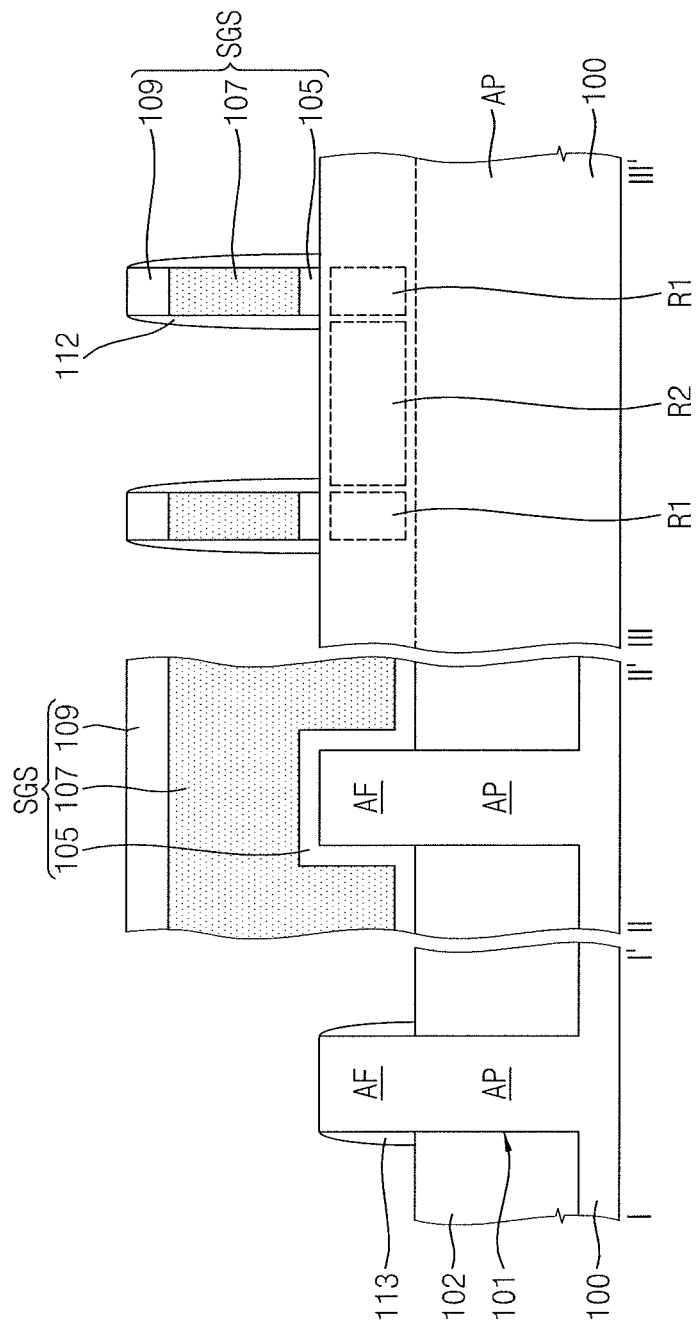

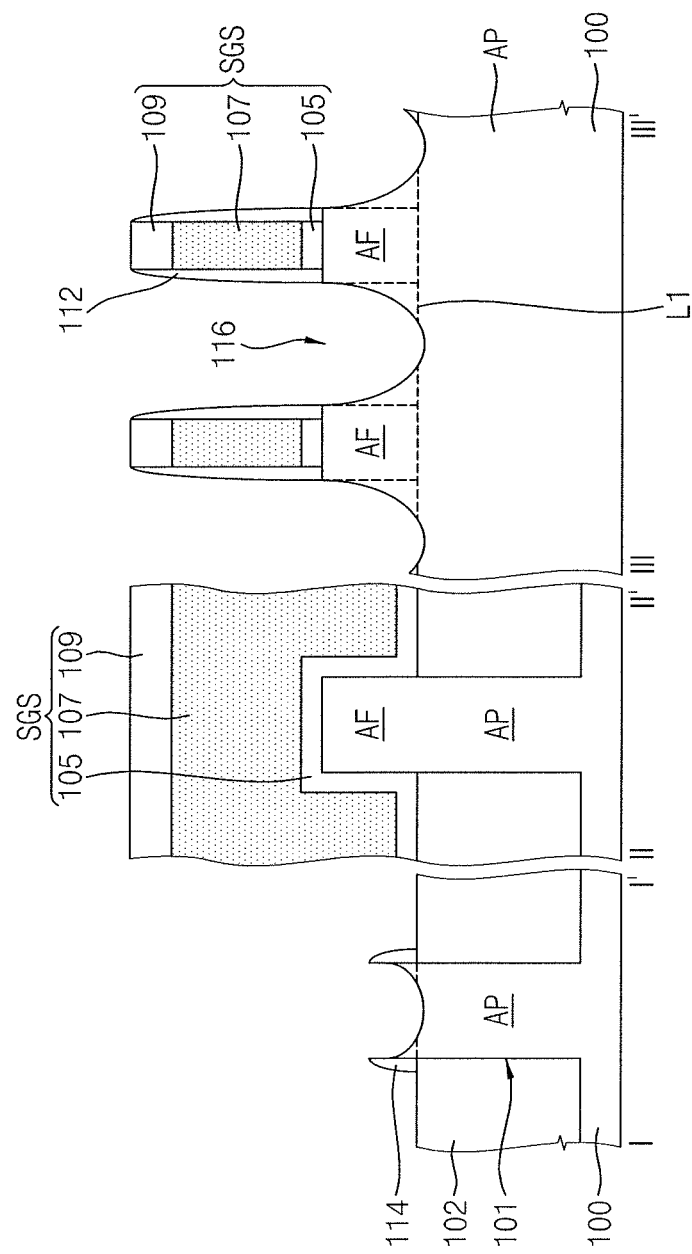

SEMICONDUCTOR DEVICE INCLUDING FIN FIELD EFFECT TRANSISTOR AND METHOD OF MANUFACTURING THE SAME

CROSS-REFERENCE TO RELATED APPLICATION

Korean Patent Application No. 10-2018-0033983, filed on Mar. 23, 2018, in the Korean Intellectual Property Office (KIPO), and entitled: "Semiconductor Device Including Fin Field Effect Transistor and Method of Manufacturing the Same," is incorporated by reference herein in its entirety.

BACKGROUND

1. Field

Embodiments relate to a semiconductor device including a fin field-effect transistor and a method of manufacturing the same.

2. Discussion of the Related Art

A degree of integration of a semiconductor device may be desirably increased.

SUMMARY

The embodiments may be realized by providing a semiconductor device including an active pattern protruding from a substrate; a plurality of gate structures each including a gate electrode and crossing the active pattern; and a source/drain region between the plurality of gate structures, wherein the source/drain region includes a high concentration doped layer in contact with a bottom surface of a recessed region in the active pattern, a first epitaxial layer in contact with an upper surface of the high concentration doped layer and a sidewall of the recessed region, and a second epitaxial layer on the first epitaxial layer, and the high concentration doped layer has a first area in contact with the bottom surface of the recessed region and a second area in contact with the sidewall of the recessed region, the first area being wider than the second area.

The embodiments may be realized by providing a semiconductor device including an active pattern protruding from a substrate; a plurality of gate structures each including a gate electrode and crossing the active pattern; and a source/drain region between the plurality of gate structures, wherein the source/drain region includes a first epitaxial layer in contact with a bottom surface and a sidewall of a recessed region in the active pattern, a high concentration doped layer in contact with an upper surface of a bottom end of the first epitaxial layer, and a second epitaxial layer covering the high concentration doped layer and the first epitaxial layer, and the high concentration doped layer has a first area in contact with the upper surface of the bottom of the first epitaxial layer and a second area in contact with a sidewall of the first epitaxial layer, the first area being wider than the second area.

The embodiments may be realized by providing a semiconductor device including an active pattern protruding from a substrate; a plurality of gate structures each including a gate electrode and crossing the active pattern; and a source/drain region between the plurality of gate structures, wherein the source/drain region includes an implant doped layer below a recessed region in the active pattern, a first epitaxial layer in the recessed region, and a second epitaxial layer on the first epitaxial layer.

The embodiments may be realized by providing a method of manufacturing a semiconductor device, the method including forming an active pattern that protrudes from a substrate; forming a plurality of sacrificial gate patterns crossing the active pattern; forming a recessed region in the active pattern between the plurality of sacrificial gate patterns; forming a high concentration doped layer in contact with a bottom surface of an inside of the recessed region; forming a first epitaxial layer in contact with an upper surface of the high concentration doped layer and a sidewall of the recessed region; forming a second epitaxial layer on the first epitaxial layer; forming a third epitaxial layer on the second epitaxial layer; and removing the plurality of sacrificial gate patterns and forming a plurality of gate electrodes.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, semiconductor devices including a fin field-effect transistor (FinFET) according to example embodiments, and methods of manufacturing the same will be described with reference to the accompanying drawings.

Figure 1:
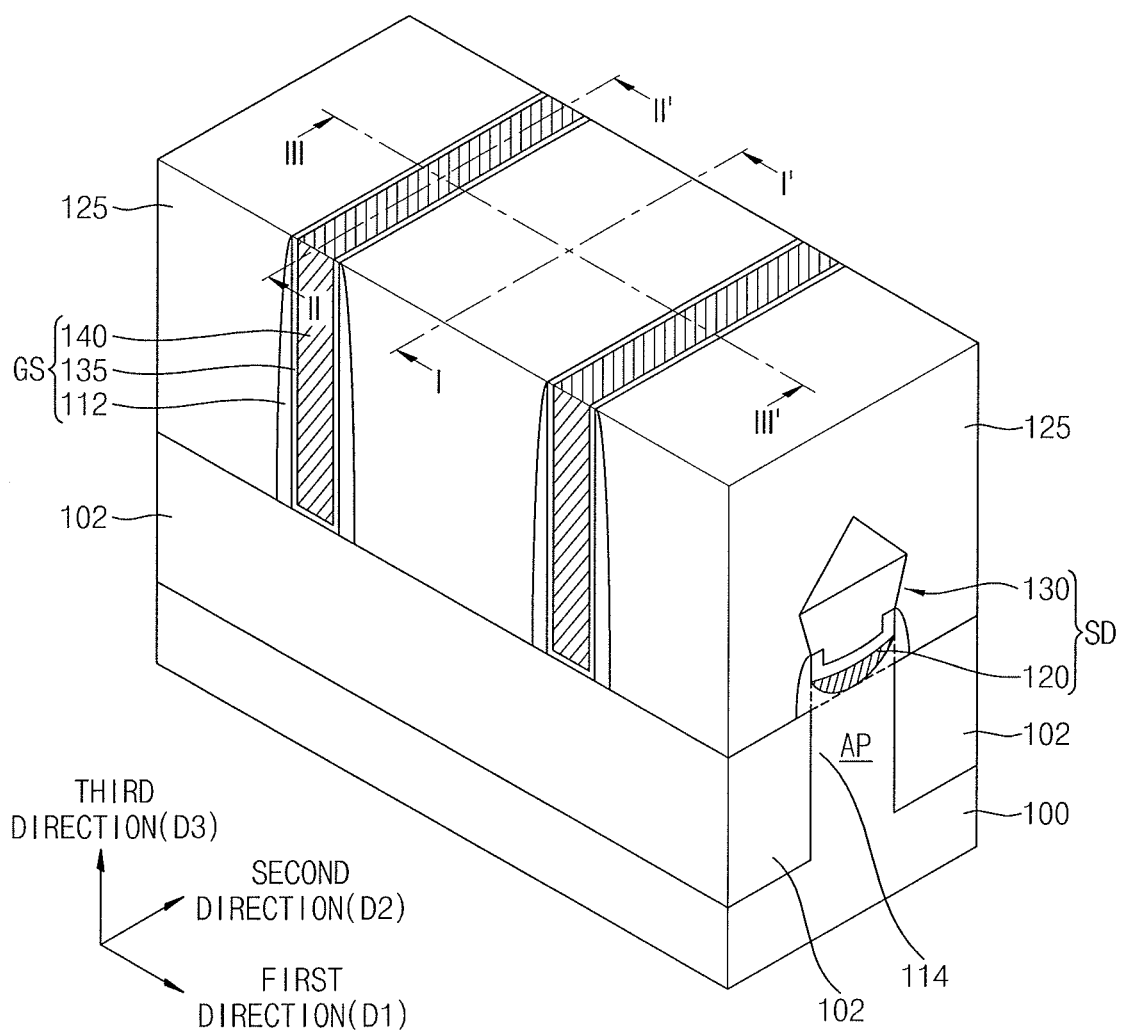
FIG. 1 illustrates a perspective view showing a structure of a fin field-effect transistor (FinFET) according to an example embodiment.
Figure 2:
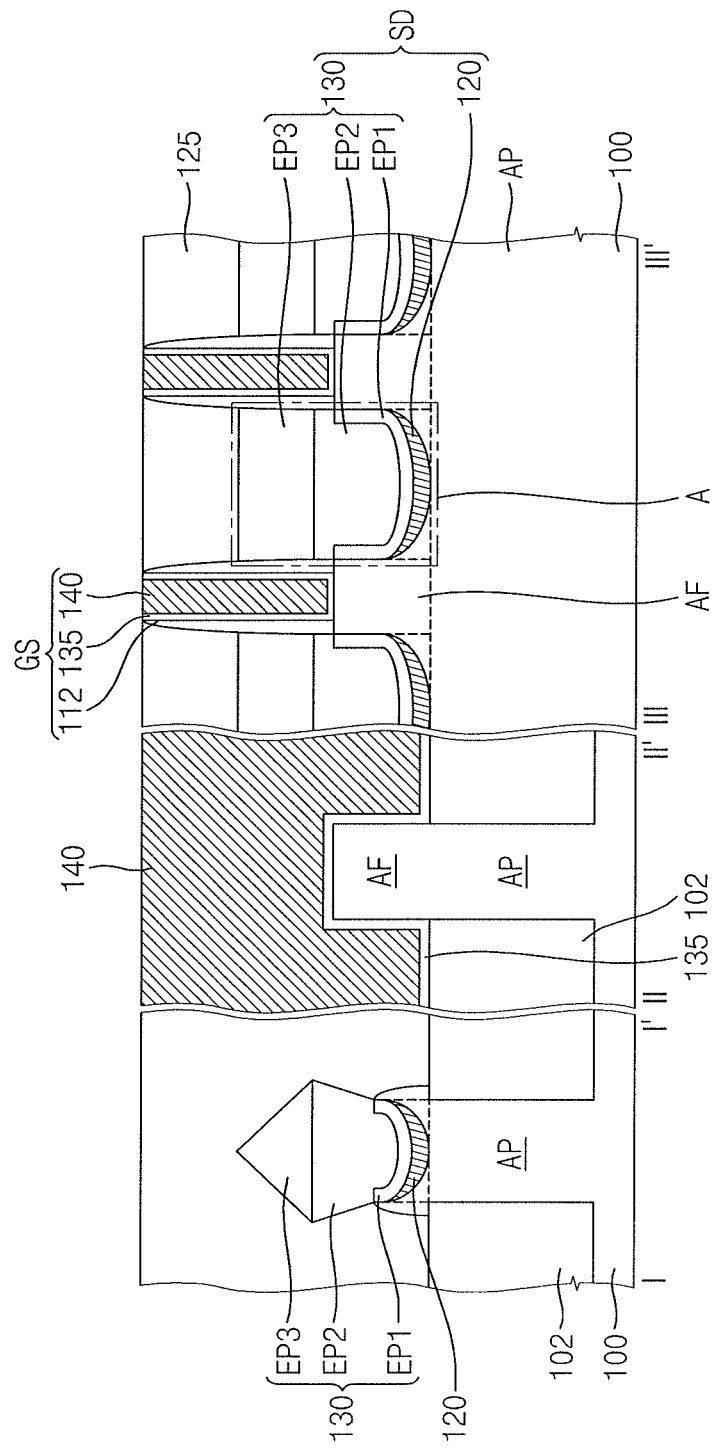
FIG. 2 illustrates a cross-sectional view taken along lines I-I', II-II', and III-III' of FIG. 1.
Figure 3:
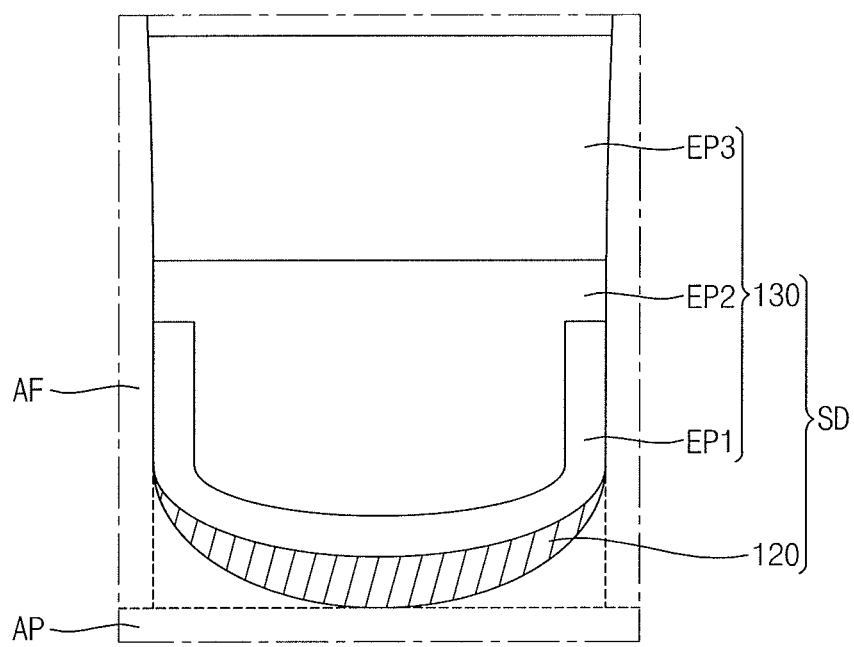
FIG. 3 illustrates an enlarged view of a portion A shown in FIG. 2.

FIG. 1 illustrates a perspective view showing a structure of a FinFET according to an example embodiment. FIG. 2 illustrates a cross-sectional view taken along lines I-I', II-II', and III-III-' of FIG. 1. FIG. 3 illustrates an enlarged view of a portion A shown in FIG. 2.

Referring to FIGS. 1 to 3, a semiconductor device including the FinFET according to the example embodiment may include a substrate 100, an active pattern AP formed on the substrate 100, a gate structure GS in which a gate electrode 140 is formed, and a source/drain region SD in which a high concentration doped layer 120 is formed.

The substrate 100 may be a semiconductor substrate. For example, the substrate 100 may be a bulk silicon substrate or a silicon-on-insulator (SOI) substrate. The active pattern AP may be formed to protrude from an upper surface of the substrate 100. The active pattern AP may be disposed on the upper surface of the substrate 100 in the form of a bar extending in or along a first direction D1. A long-axis of the active pattern AP may be disposed in the first direction D1 and a short-axis of the active pattern AP may be disposed in a second direction D2 crossing the first direction D1. The active pattern AP may protrude (e.g., from the substrate 100) in a third direction D3 perpendicular to the first direction D1 and the second direction D2. The active pattern AP may be a portion of the substrate 100 or may include an epitaxial layer grown from the substrate 100. The active pattern AP may be doped with a first conductivity type impurity. In an implementation, e.g., as illustrated in FIGS. 1 and 2, one active pattern AP may be included. In an implementation, a plurality of active patterns AP may be disposed on the substrate 100.

Device isolation patterns 102 may be disposed at both sides of the active pattern AP. The device isolation patterns 102 may include, e.g., an oxide, nitride, and/or oxynitride. The device isolation patterns 102 may be disposed to surround sidewalls of the active pattern AP and may separate active patterns AP of FinFETs from each other. For example, the device isolation patterns 102 may cover portions of the sidewalls of the active pattern AP. For example, an upper portion of the active pattern AP may be exposed by the device isolation patterns 102. The upper portion of the active pattern AP, which is exposed by the device isolation patterns 102, may be defined as an active fin AF. The active fin AF may be locally disposed below the gate structure GS.

The gate structure GS crossing the active pattern AP may be disposed on the substrate 100. The gate structure GS may protrude in the third direction D3 and extend (e.g., lengthwise) in the second direction D2. The gate structure GS may be formed to cross the active pattern AP and may cover an upper surface and side surfaces of the active fin AF.

The gate structure GS may include the gate electrode 140, a gate dielectric pattern 135, and gate spacers 112. The gate electrode 140 may be disposed to cross the active pattern AP. The gate spacers 112 may be disposed on both sidewalls of the gate electrode 140. The gate dielectric pattern 135 may be disposed between the gate spacer 112 and the gate electrode 140. The gate dielectric pattern 135 may also be disposed between the gate electrode 140 and the active fin AF. The gate dielectric pattern 135 may horizontally extend from the active fin AF to partially cover an upper surface of each of the device isolation patterns 102. The gate dielectric pattern 135 may extend along a bottom surface of the gate electrode 140.

In an implementation, the gate electrode 140 may include at least one of a conductive metal nitride (e.g., titanium nitride, tantalum nitride, or the like) and a metal (e.g., aluminum, tungsten, or the like). In an implementation, the gate spacer 112 may include nitride (e.g., silicon nitride). The gate dielectric pattern 135 may include at least one high dielectric film. In an implementation, the gate dielectric pattern 135 may include at least one of, e.g., hafnium oxide, hafnium silicate, zirconium oxide, and zirconium silicate.

A plurality of gate structures GS may be provided, and the plurality of gate structures GS may cross at least one active pattern AP. For example, a pair of gate structures GS may be spaced apart from each other in the first direction D1 and may extend in the second direction D2 to cross one active pattern AP.

Recessed regions 116 (see FIGS. 7A and 7B) may be formed on the active patterns AP formed at both sides of the gate structures GS adjacent to each other. For example, the recessed region 116 may be formed between the plurality of gate structures GS. In the drawings, the recessed region 116 is shown as being formed between two gate structures GS adjacent to each other. In an implementation, the recessed region 116 may be defined in a space between the active fins AF that are locally disposed below the gate structures GS. The recessed region 116 may be formed to have a U shape that is tapered downwardly. The high concentration doped layer 120 and a source/drain epitaxial layer 130 may be formed inside each of the recessed regions 116 to form a source/drain region SD. For example, a source may be formed at one side of the source/drain SD with the gate electrode 140 interposed therebetween and a drain may be formed at the other side thereof.

As a semiconductor device is scaled down, a FinFET may be formed by increasing a height of the active fin AF and deeply forming the recessed region 116 of the source/drain region SD. When the recessed region 116 is formed with a depth of 50 to 60 nm, a depth of a usable channel may be increased while an actual depth of the channel may not be increased according to a shape of the recessed region 116. When the recessed region 116 is deeply formed, the recessed region 116 may not have a uniform U-shape due to the limitation of a manufacturing process, and the recessed region 116 may have a shape that is tapered downwardly. As a result, a width of a source/drain channel may be determined according to a profile of the recessed region 116. The width of the source/drain channel in a bottom region of the recessed region 116 may be wider than that of the source/drain channel in a top region of the recessed region 116. Therefore, a deviation could occur in width of the channels, and the efficiency of the semiconductor device could be lowered.

In the semiconductor device including a FinFET according to the example embodiment, the high concentration doped layer 120 may be disposed at a lower end portion of the recessed region 116. The source/drain epitaxial layer 130 may cover the high concentration doped layer 120. The high concentration doped layer 120 may be disposed at the lower end portion of the recessed region 116 so that widths of the top region and the bottom region in the source/drain channel may be constant.

The high concentration doped layer 120 may be formed to have a predetermined height (e.g., 1 to 10 nm) from a lower end portion of the recessed region 116. The high concentration doped layer 120 may include a semiconductor material having a lattice constant that is different from that of the substrate 100. Silicon (Si), silicon-germanium (SiGe), or germanium (Ge) may be grown inside the recessed region 116 in an epitaxial manner to have a thickness of 1 to 10 nm to form an epitaxial layer, e.g., a silicon-germanium layer. Thereafter, the silicon-germanium layer (the epitaxial layer) may be doped with a first conductivity type impurity to form the high concentration doped layer 120. The silicon-germanium layer (the epitaxial layer) may be doped with at least one of phosphorus (P), carbon (C), boron (B), tin (Sn), gallium (Ga), and arsenic (As) at a high concentration to form the high concentration doped layer 120. In an implementation, the silicon-germanium layer may be doped with carbon (C) along with another dopant. A junction may be formed at an interface between the high concentration doped layer 120 and the active pattern AP. The high concentration doped layer 120 may be formed to cover a bottom surface of the recessed region 116. The high concentration doped layer 120 may have a predetermined thickness, and the high concentration doped layer 120 may be in contact with a portion of a sidewall of the recessed region 116 but may not be formed to fully cover the sidewall of the recessed region 116. For example, the high concentration doped layer 120 may fully cover the bottom surface of the recessed region 116, and may cover only a portion of the sidewall of the recessed region 116. Therefore, the high concentration doped layer 120 may be in contact with the entire bottom surface of the recessed region 116 to cover a first area. The high concentration doped layer 120 may be in contact with a portion of the sidewall of the recessed region 116 to cover a second area. In an implementation, the first area of the high concentration doped layer 120 in contact with the bottom surface of the recessed region 116 may be wider than the second area of the high concentration doped layer 120 in contact with the sidewall of the recessed region 116.

For example, the epitaxial layer may be grown with at least one gas of dichlorosilane (DCS), $SiH_4$, $Si_2H_6$, $GeH_4$, $B_2H_6$, and +HCl and doped with boron (B) to form a high concentration SiGe:B doped layer 120. In this case, a concentration of germanium (Ge) may range from 10 to 50 atom %, and a concentration of boron (B) may range from $1\times10^{18}$ to $1\times10^{21}$ atom/cm$^3$. When the epitaxial layer is doped with carbon (C), tin (Sn), gallium (Ga), or arsenic (As), a concentration of an impurity may range from $1\times10^{18}$ to $1\times10^{21}$ atom/cm$^3$.

The source/drain epitaxial layer 130 may be disposed in the recessed region 116. The source/drain epitaxial layer 130 may be formed to cover an upper portion of the high concentration doped layer 120. The source/drain epitaxial layer 130 may be formed cover the sidewall of the recessed region 116. The source/drain epitaxial layer 130 may have a structure in which a plurality of epitaxial layers EP1 to EP3 are sequentially stacked. The plurality of epitaxial layers EP1 to EP3 may include a semiconductor material having a lattice constant that is different from that of the substrate 100, and may be doped with a second conductivity type impurity that is different from the first conductivity type impurity.

A first epitaxial layer EP1 may be disposed to cover the sidewall of the recessed region 116 and the high concentration doped layer 120. In this case, the first epitaxial layer EP1 may be in contact with an upper surface of the high concentration doped layer 120 and in contact with the sidewall of the recessed region 116. The first epitaxial layer EP1 may be formed to be thicker than the high concentration doped layer 120 that serves as a buffer layer. The high concentration doped layer 120 may be disposed below the first epitaxial layer EP1, and a thickness of a bottom of the first epitaxial layer EP1 may be greater than a thickness of a sidewall of the first epitaxial layer EP1. The first epitaxial layer EP1 may include a low concentration silicon-germanium layer. A germanium concentration of the first epitaxial layer EP1 may range from 10 to 30 atom %. The first epitaxial layer EP1 may be doped with carbon (C) or boron (B) at a low concentration.

Second and third epitaxial layers EP2 and EP3 may be disposed to cover the first epitaxial layer EP1. Each of the second and third epitaxial layers EP2 and EP3 may be an epitaxial layer including a high concentration semiconductor material as a bulk layer for causing stress to the active fin AF. For example, each of the second and third epitaxial layers EP2 and EP3 may include a silicon-germanium layer. In this case, a germanium concentration of each of the second and third epitaxial layers EP2 and EP3 may be greater than the germanium concentration of the first epitaxial layer EP1. For example, the germanium concentration of each of the second and third epitaxial layers EP2 and EP3 may range from 30 to 70 atom %.

In an implementation, a concentration of the second conductivity type impurity with which the second and third epitaxial layers EP2 and EP3 are doped may be greater than a concentration of an impurity of the first epitaxial layer EP1. Each of the second and third epitaxial layers EP2 and EP3 may be doped with carbon (C) or boron (B). In addition, the concentration of the second conductivity type impurity with which the second epitaxial layer EP2 is doped may be greater than a concentration of an impurity of the third epitaxial layer EP3. For example, when the first to third epitaxial layers EP1 to EP3 are doped with boron, a concentration of carbon or boron with which the second epitaxial layer EP2 is doped may range from $1\times10^{21}$ to $5\times10^{21}$ atom/cm$^3$. A concentration of carbon or boron with which the first epitaxial layer EP1 is doped may range from $1\times10^{18}$ to $1\times10^{19}$ atom/cm$^3$.

For example, a concentration of carbon or boron with which the third epitaxial layer EP3 is doped may be $1\times10^{20}$ atom/cm$^3$ or higher, and may be lower than that of the second epitaxial layer EP2.

In an implementation, an interface between the second and third epitaxial layers EP2 and EP3 may be located at a level lower than an upper surface of the active fin AF. In an implementation, an uppermost portion of the third epitaxial layer EP3 may be located at a level lower than the upper surface of the active fin AF.

The source/drain epitaxial layer 130 and the high concentration doped layer 120 described above may constitute a source/drain region SD of a three-dimensional FinFET. The semiconductor device including the high concentration doped layer 120 and the source/drain epitaxial layer 130 may be a p-channel metal-oxide-semiconductor (PMOS) transistor. The source/drain epitaxial layer 130 may include a material (e.g., silicon germanium) having a lattice constant greater than that of the substrate 100, and a compressive force may be provided to the active fin AF. As a result, the mobility of electrons, which are major carriers, may be improved in a channel region of the PMOS transistor. In an implementation, the semiconductor device including the high concentration doped layer 120 and the source/drain epitaxial layer 130 may be an re-channel metal-oxide-semiconductor (NMOS) transistor. In this case, impurities with which the high concentration doped layer 120 and the source/drain epitaxial layer 130 are doped may be different.

A lower interlayer insulating film 125 which covers the source/drain region SD may be disposed on the substrate 100. An upper surface of the lower interlayer insulating film 125 and upper surfaces of the gate structures GS may be substantially coplanar. The lower interlayer insulating film 125 may include at least one of a silicon oxide film, a silicon nitride film, a silicon oxynitride film, and a low dielectric film.

In an implementation, an upper interlayer insulating film may be disposed on the substrate 100 including the gate structure GS. The upper interlayer insulating film may include oxide, nitride, and/or oxynitride. Contact holes may be disposed to pass through the upper interlayer insulating film and the lower interlayer insulating film 125 and expose the source/drain region SD. Contact plugs may be disposed in each of the contact holes. In addition, interconnections connected to each of the contact plugs may be disposed on the upper interlayer insulating film. The interconnections may be electrically connected to the source/drain regions SD using the contact plugs. The contact plugs and the interconnections may include a conductive material.

In a three-dimensional FET such as the FinFET according to the example embodiment, some surfaces of the active fin AF may be used as channels, unlike in a two-dimensional device. For example, not only the upper surface of the active fin AF but also the side surfaces may be used as the channels. Therefore, making a sidewall profile of the active fin AF according to a height thereof uniform may be an important factor in the characteristics of the semiconductor device. As semiconductor devices are highly integrated, it may not be easy to realize an active fin having a uniform sidewall profile due to various constraints.

According to the example embodiment, the high concentration doped layer 120 may be disposed on the lower end portion of the recessed region 116, and the source/drain region SD having a U-shaped cross section may be electrically formed by adjusting a concentration of an impurity with which the high concentration doped layer 120 is doped. For example, the recessed region 116 may have a shape in which a physical width of a top region of the source/drain region SD is wide and a physical width of a bottom region is narrow. Lengths of electrical channels between the top and bottom regions of the source/drain region SD may be constantly formed by disposing the high concentration doped layer 120 on the lower end portion of the recessed region 116. Further, the source/drain epitaxial layer 130 may be disposed above the high concentration doped layer 120, and a concentration of an impurity with which the source/drain epitaxial layer 130 is doped may be adjusted. The lengths of the channels between the top and bottom regions of the source/drain region SD may be constantly formed by the epitaxial layer 130. For example, although physical widths of the top and bottom regions of the source/drain region SD may be different, the lengths of the electrical channels between the top and bottom regions of the source/drain region SD may be constantly formed or uniform by or due to the high concentration doped layer 120 and the epitaxial layer 130. Accordingly, the electrical characteristics of the semiconductor device may be improved by electrically realizing a U-shaped junction profile.

FIGS. 4A to 10B illustrate stages in a method of manufacturing a semiconductor device according to an example embodiment.

Figure 4A:
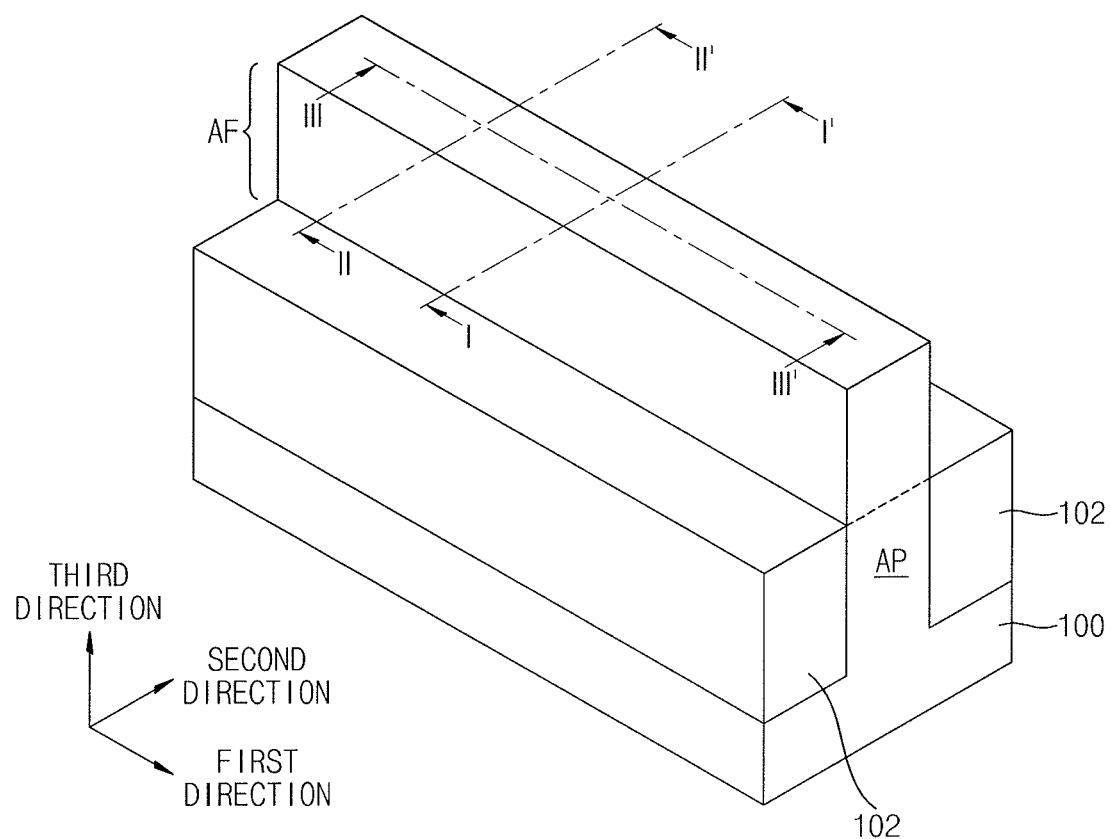
FIGS. 4A to 10B illustrate stages in a method of manufacturing a semiconductor device according to an example embodiment.
Figure 4B:
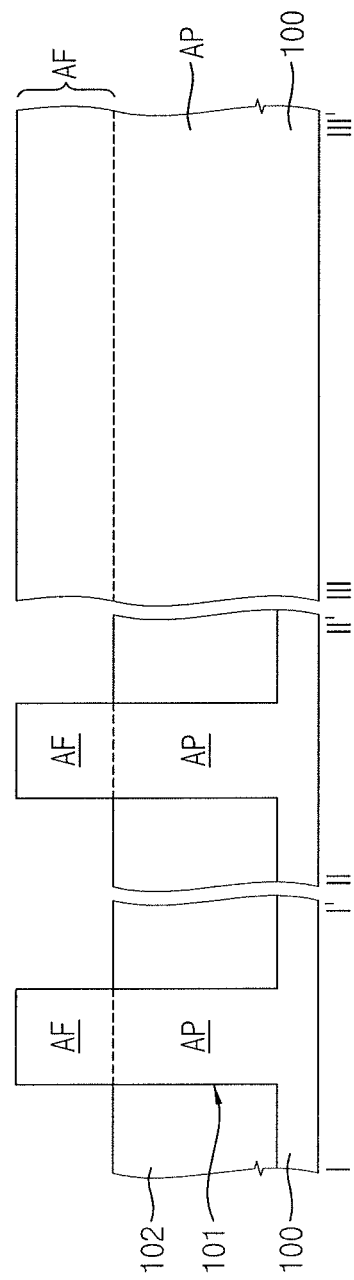

Referring to FIGS. 4A and 4B, an active pattern AP may be formed by patterning a substrate 100. The active pattern AP may be formed by forming a mask pattern on the substrate 100 and performing an anisotropic etching process using the mask pattern as an etch mask. The active pattern AP may be doped with a first conductivity type impurity.

A plurality of trenches 101 which define the active pattern AP may be formed in the substrate 100 at the time of forming the active pattern AP. The plurality of trenches 101 may extend in a first direction D1. The plurality of trenches 101 may be spaced apart from each other in a second direction D2 crossing the first direction D1. Accordingly, the active pattern AP may be formed to extend in the first direction D1.

In FIG. 4A, one active pattern AP is shown, a portion of an entire region of the substrate 100 is shown, and a plurality of active patterns AP may be disposed on the substrate 100. The plurality of active patterns AP may extend in the first direction D1 and may be spaced apart from each other in the second direction D2.

Subsequently, device isolation patterns 102 may be formed in each of the trenches 101 to expose an upper sidewall of the active pattern AP. Upper surfaces of the device isolation patterns 102 may be formed to be located at a lower level than an upper surface of the active pattern AP.

A device isolation film filling the trenches 101 may be formed on the substrate 100. Subsequently, a process of planarizing the device isolation film may be performed such that an upper surface of the mask pattern remaining on the active pattern AP is exposed. Then, a planarized upper portion of the device isolation film may be partially recessed. Correspondingly, the upper portion of the device isolation film may be recessed so that the device isolation patterns 102 which expose the upper sidewall of the active pattern AP may be formed. The device isolation film may include silicon oxide and may be formed by a chemical vapor deposition (CVD) process. The planarization of the device isolation film may be performed using an etch-back process and/or a chemical mechanical polishing (CMP) process. For example, the recess of the device isolation film may be performed using a wet etching process. An etching process for forming the active pattern AP may be performed using an etching condition having an etch selectivity. Here, the upper portion of the active pattern AP exposed by the device isolation patterns 102 may be defined as an active fin AF. After the device isolation patterns 102 are formed, the mask pattern (not shown) disposed on the active pattern AP may be removed.

Figure 5A:
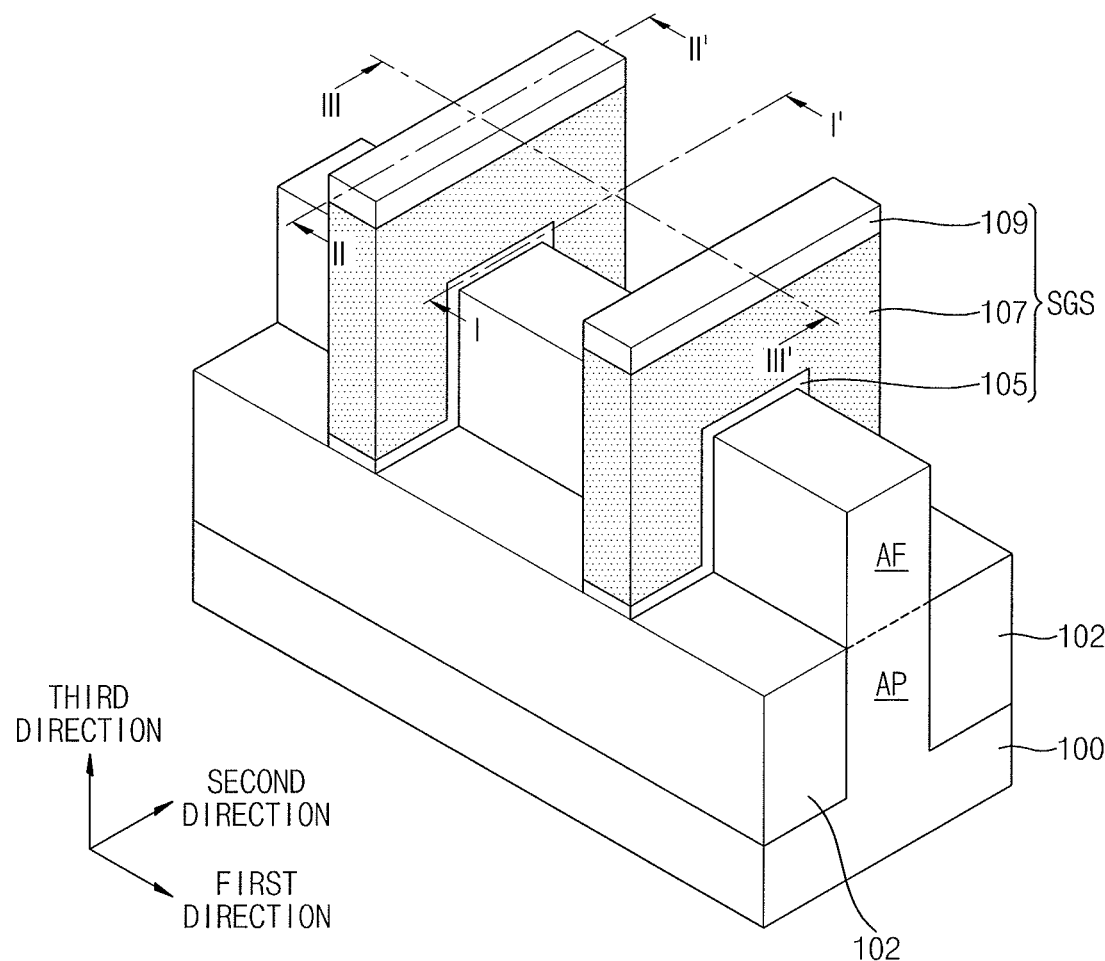
Figure 5B:
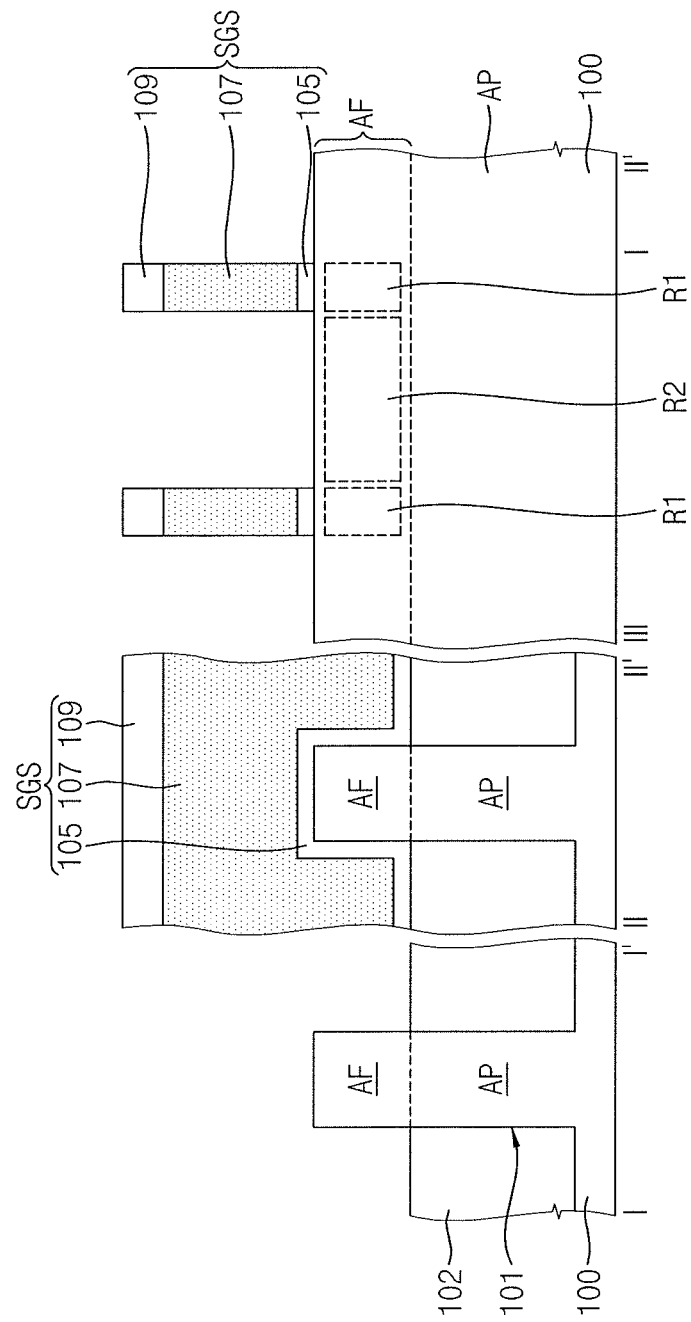

Referring to FIGS. 5A and 5B, an etch stop pattern 105 may be disposed on the device isolation patterns 102 and the active fin AF. Then, a sacrificial gate pattern 107 may be formed on the etch stop pattern 105. The etch stop pattern 105 may be formed on the substrate 100 to cross the active fin AF. The active fin AF may be formed so that a length thereof extends in the first direction D1. The etch stop pattern 105 may be formed so that a length thereof extends in the second direction D2 to cross the active fin AF.

First, an etch stop film and a sacrificial gate film which cover the active fin AF may be sequentially formed on the substrate 100. For example, the etch stop film may include silicon oxide. The sacrificial gate film may include a material having an etch selectivity with respect to the etch stop film. For example, the sacrificial gate film may include polysilicon. The sacrificial gate film may be formed by a CVD process, a physical vapor deposition (PVD) process, or an atomic layer deposition (ALD) process. After the formation of the sacrificial gate film, an upper surface of the sacrificial gate film may be planarized. A gate mask pattern 109 may be formed on the planarized upper surface of the sacrificial gate film and an anisotropic etching process using the gate mask pattern 109 as an etch mask may be performed. As a result, the sacrificial gate pattern 107 crossing the active fin AF may be formed. A plurality of sacrificial gate patterns 107 may be provided, and one sacrificial gate pattern 107 or the plurality of sacrificial gate patterns 107 may cross at least one active fin AF. For example, a pair of sacrificial gate patterns 107 may be spaced apart from each other in the first direction D1 and may extend in the second direction D2 crossing the first direction D1 to cross the active fin AF. The gate mask pattern 109 may include, for example, silicon nitride.

After the formation of the sacrificial gate patterns 107, the etch stop film disposed at both sides of the sacrificial gate patterns 107 may be removed and the etch stop pattern 105 may be formed below each of the sacrificial gate patterns 107. The etch stop pattern 105 may extend along bottom surfaces of the sacrificial gate patterns 107 to cover portions of the upper surfaces of the device isolation patterns 102.

As the sacrificial gate patterns 107 are formed to cross the active fin AF, first regions R1 and second regions R2 may be defined in the active fin AF. Here, the first regions R1 are portions of the active fin AF located below the sacrificial gate patterns 107. The second regions R2 may be located between the pair of sacrificial gate patterns 107. The etch stop pattern 105, the sacrificial gate patterns 107, and the gate mask pattern 109 described above may constitute a sacrificial gate structure SGS.

Figure 6A:
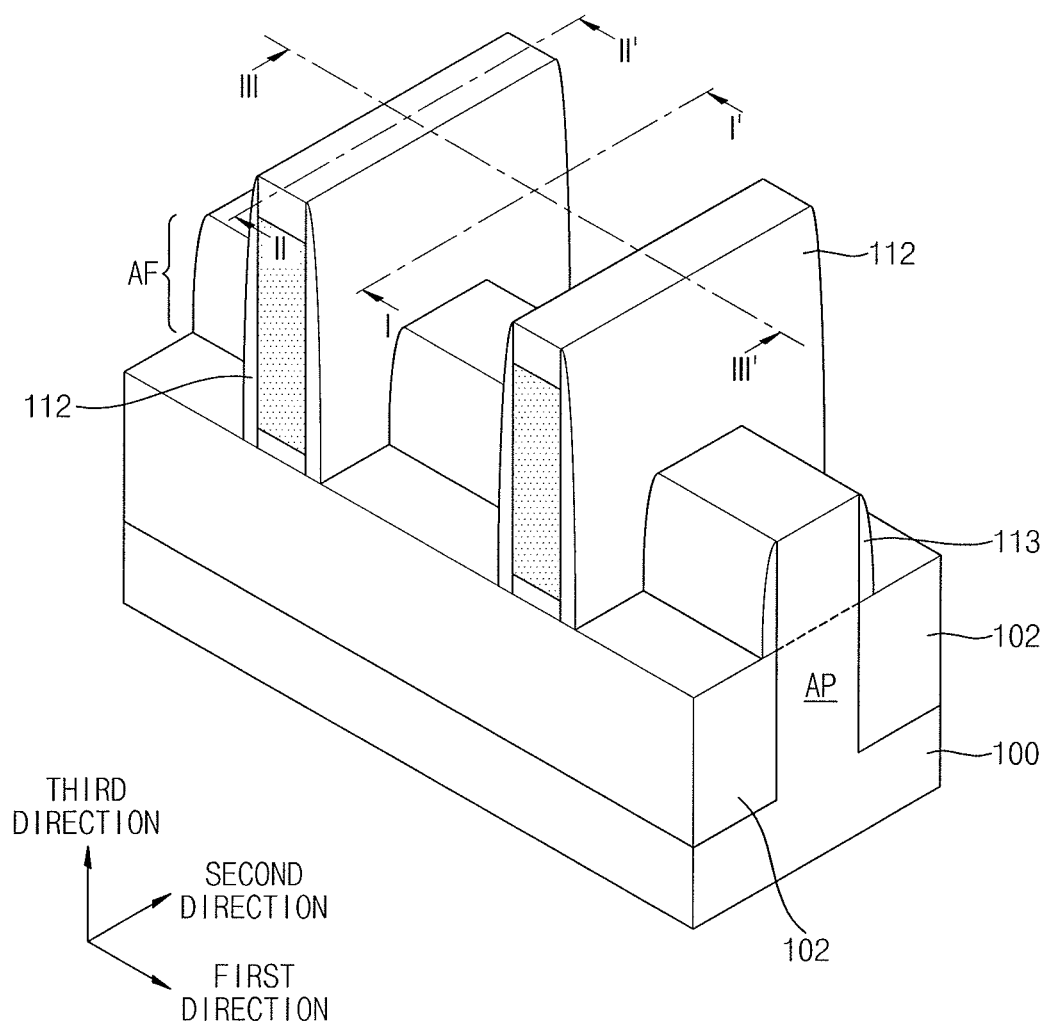

Referring to FIGS. 6A and 6B, gate spacers 112 may be formed on both sidewalls of the sacrificial gate structure SGS. A gate spacer film may be conformally formed on the substrate 100 on which the sacrificial gate structure SGS is formed. Subsequently, the gate spacers 112 may be formed by performing a full anisotropic etching process for exposing an upper surface of the sacrificial gate structure SGS. As a result of the etching process, upper surfaces of the second regions R2 of the active fin AF and the upper surfaces of the device isolation patterns 102 may be exposed.

In addition, the gate spacer film may remain and fin spacers 113 may be formed. The gate spacer film may include, e.g., silicon nitride. In an implementation, the gate spacer film may include a low-k nitride such as SiCN or SiOCN. The gate spacer film may be formed by a deposition process such as a CVD process or an ALD process.

Figure 7A:
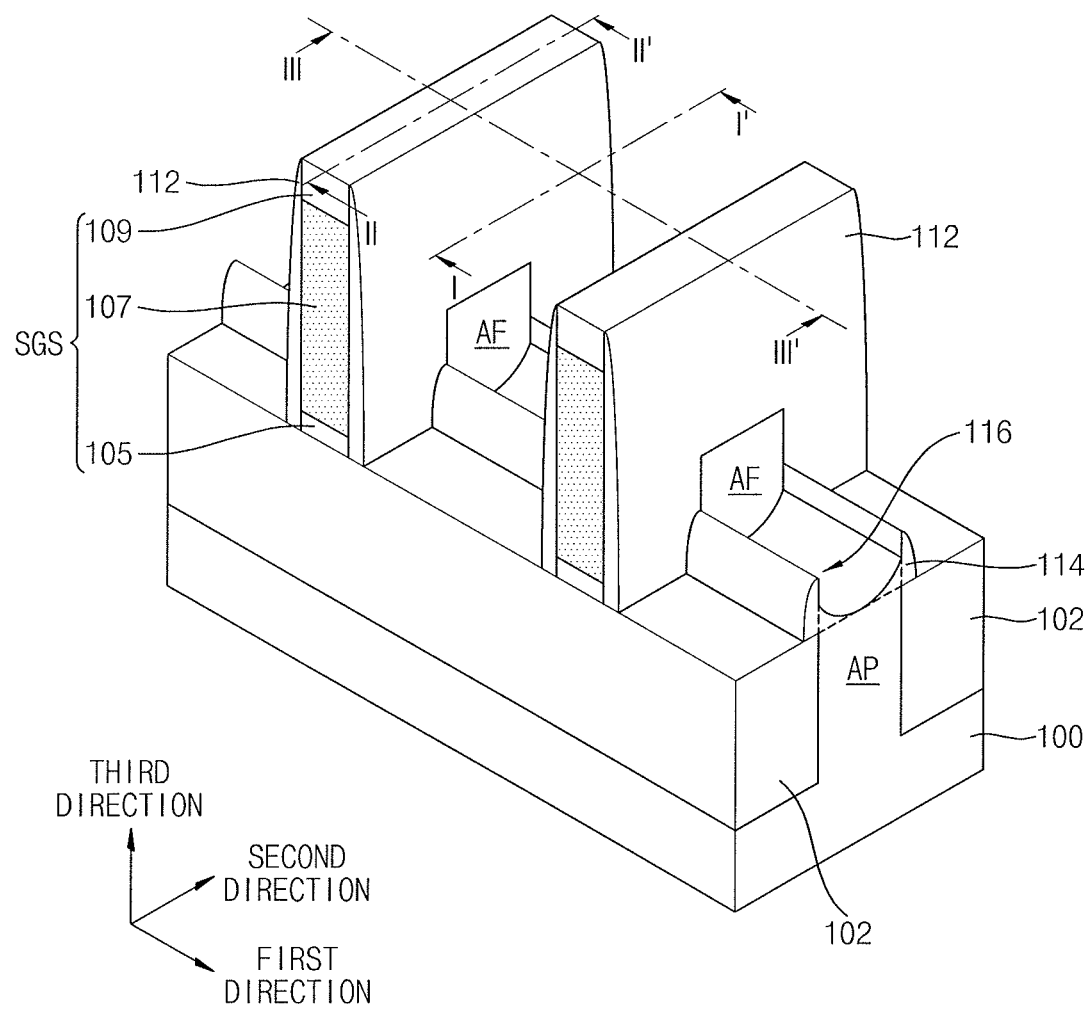
Figure 7B:
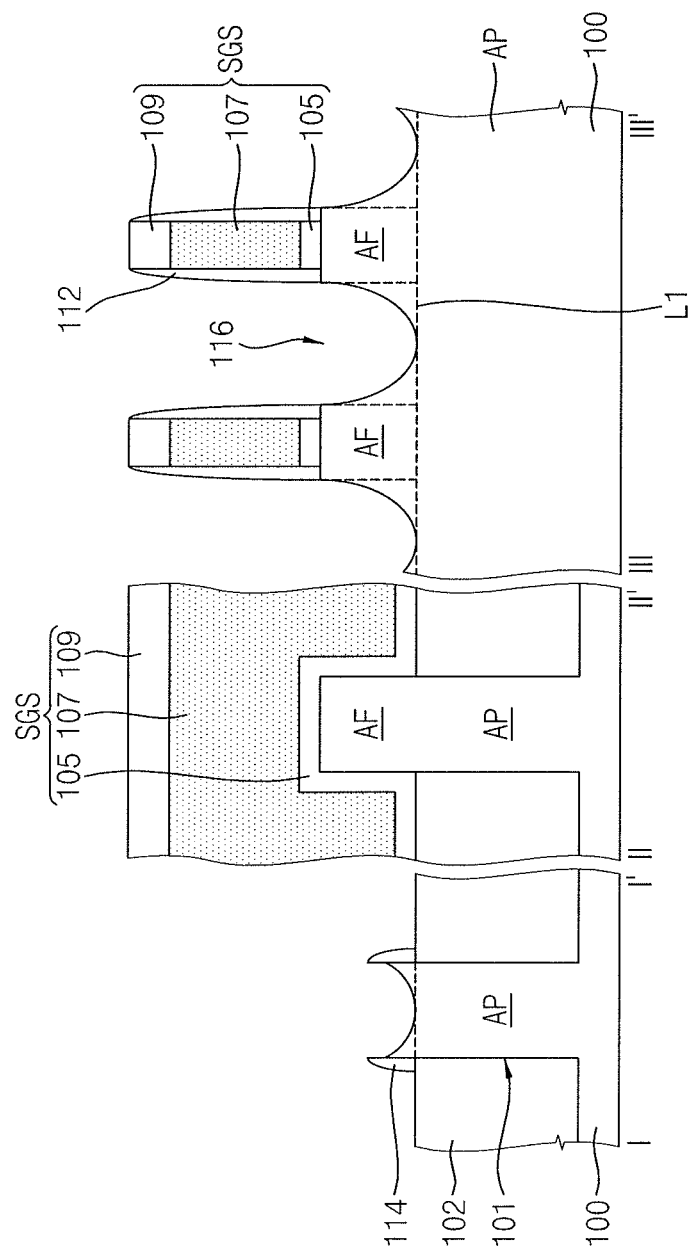

Referring to FIGS. 7A and 7B, portions of the active patterns AP disposed at both sides of the sacrificial gate structure SGS may be removed so that recessed regions 116 may be formed. The second regions R2 of the active fin AF may be removed by performing an etching process using the gate mask pattern 109 and the gate spacers 112 as etch masks, and thus the recessed regions 116 may be formed. In this case, bottom surfaces of the recessed regions 116 may be located at an interface L1 between the active pattern AP and active fin AF.

In an implementation, the recessed regions 116 may be formed by sequentially performing an anisotropic etching process and an isotropic etching process. Accordingly, the second regions R2 may be etched in a depth direction by an anisotropic etching process and may be laterally etched toward the active fin AF by an isotropic etching process. A lower portion of the recessed region 116 may have a shape which is tapered downwardly. For example, the recessed region 116 may be formed to have a U-shape in which a width of a lower portion thereof is narrow.

The shape of the recessed region 116 may be caused by a difference in etch rate according to a crystal facet of the substrate 100. For example, a [111] crystal facet of the substrate 100 may be more difficult to etch than a [100] crystal facet and a [110] crystal facet. Accordingly, when an isotropic etching process is performed, the [111] crystal facet of the substrate 100 may serve as an etch stop surface. Eventually, the shape of the recessed region 116 may be determined by first and second side surfaces having a [111] crystal facet.

In an implementation, the etching process for forming the recessed regions 116 may be performed using an etching condition having a relatively high etch selectivity with respect to the fin spacers 113 (see FIGS. 6A and 6B). While the etching process is performed, an etching amount of the fin spacers 113 may be relatively small. Accordingly, even after the second regions R2 of the active fin AF are removed, portions of the fin spacers 113 may remain on the device isolation patterns 102. For example, portions of the fin spacers 113 (see FIGS. 6A and 6B) may remain so that auxiliary spacers 114 may be formed.

Figure 7C:
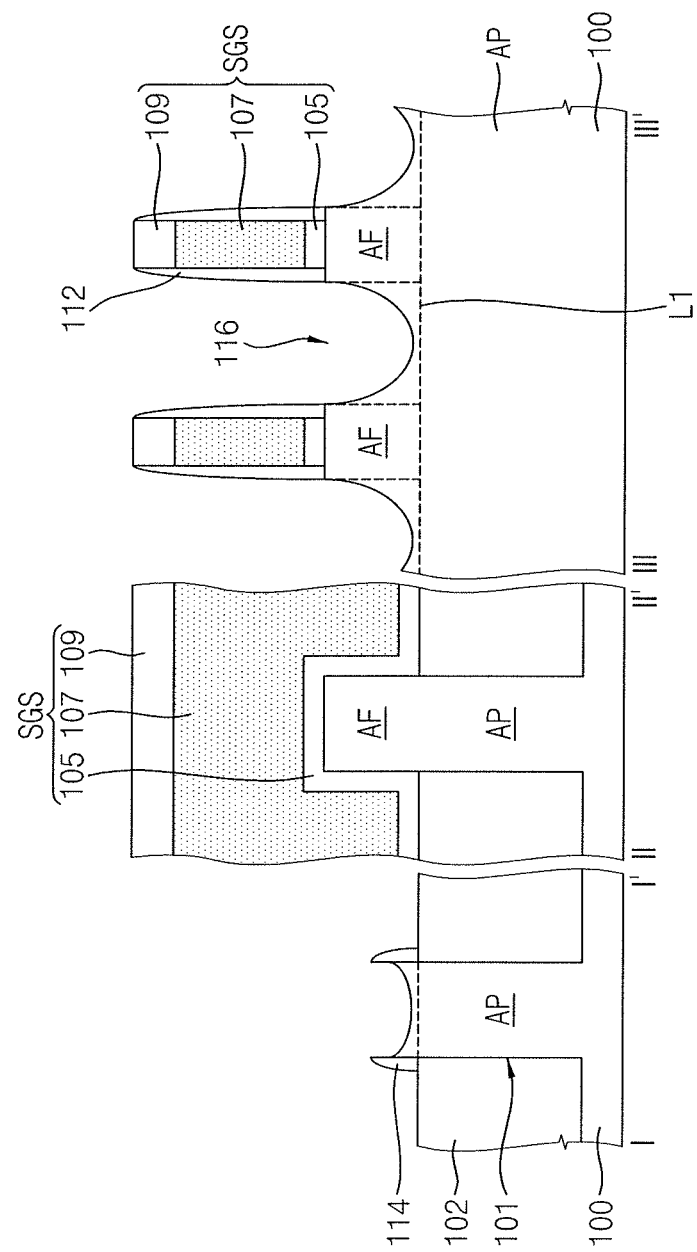

Referring to FIGS. 7C and 7D, depths of the recessed regions 116 may be adjusted according to conditions of the manufacturing process. For example, as shown in FIG. 7C, the depths of the recessed regions 116 may be reduced by reducing an amount of removal of the active pattern AP. In this case, the bottom surfaces of the recessed regions 116 may be located at a higher level than the interface L1 between the active pattern AP and active fin AF. For example, as shown in FIG. 7D, the depths of the recessed regions 116 may be increased by increasing the amount of removal of the active pattern AP. In this case, the bottom surfaces of the recessed regions 116 may be located at a lower level than the interface L1 between the active pattern AP and active fin AF.

Referring to FIGS. 8A to 8D and 9, a high concentration doped layer 120 may be formed below the recessed regions 116 and a source/drain epitaxial layer 130 may be formed to cover the high concentration doped layer 120. The high concentration doped layer 120 and the source/drain epitaxial layer 130 may be disposed inside the recessed regions 116 to form a source/drain SD. For example, a source may be formed at one side of the source/drain SD with the gate electrode 140 interposed therebetween and a drain may be formed at the other side thereof.

Silicon (Si), silicon-germanium (SiGe), or germanium (Ge) may be grown inside the recessed region 116 in an epitaxial manner to have a thickness of 1 to 10 nm to form an epitaxial layer (e.g., a silicon-germanium layer).

For example, the silicon-germanium layer (the epitaxial layer) may be formed under conditions having a pressure of 10 to 300 Torr and a temperature of 500 to 700° C. Then, the silicon-germanium layer (e.g., the epitaxial layer) may be doped with a first conductivity type impurity to form the high concentration doped layer 120. The high concentration doped layer 120 may include a semiconductor material having a lattice constant that is different from that of the substrate 100.

For example, the silicon-germanium layer (the epitaxial layer) may be doped with at least one of phosphorus (P), carbon (C), boron (B), tin (Sn), gallium (Ga), and arsenic (As) at a high concentration to form the high concentration doped layer 120. In an implementation, the silicon-germanium layer may be doped with carbon (C) along with another dopant. A junction may be formed at an interface between the high concentration doped layer 120 and active pattern AP. The high concentration doped layer 120 may cover a bottom surface of the recessed region 116. The high concentration doped layer 120 may have a predetermined thickness, and the high concentration doped layer 120 may be in contact with a portion of the sidewall of the recessed region 116 but may not be formed so as to fully cover the sidewall of the recessed region 116. For example, the high concentration doped layer 120 may fully cover the bottom surface of the recessed region 116 and may cover only a portion of the sidewall of the recessed region 116. Therefore, the high concentration doped layer 120 may be in contact with the entire bottom surface of the recessed region 116 to cover a first area. The high concentration doped layer 120 may be in contact with the portion of the sidewall of the recessed region 116 to cover a second area. In this case, the first area of the high concentration doped layer 120 in contact with the bottom surface of the recessed region 116 may be wider or greater than the second area of the high concentration doped layer 120 in contact with the sidewall of the recessed region 116. The sidewall of the recessed region 116 may be in contact with the first epitaxial layer EP1.

The epitaxial layer may be grown with at least one gas of dichlorosilane (DCS), $SiH_4$, $Si_2H_6$, $GeH_4$, $B_2H_6$, and +HCl under conditions having a pressure of 10 to 300 Torr and a temperature of 500 to 700° C. and may be doped with boron (B) to form a high concentration SiGe:B doped layer 120. In this case, a concentration of germanium (Ge) may range from 10 to 50 atom %, and a concentration of boron (B) may range from $1\times10^{18}$ to $1\times10^{21}$ atom/cm$^3$. For example, when the epitaxial layer is doped with carbon (C), tin (Sn), gallium (Ga), or arsenic (As), a concentration of an impurity may range from $1\times10^{18}$ to $1\times10^{21}$ atom/cm$^3$.

Figure 8A:
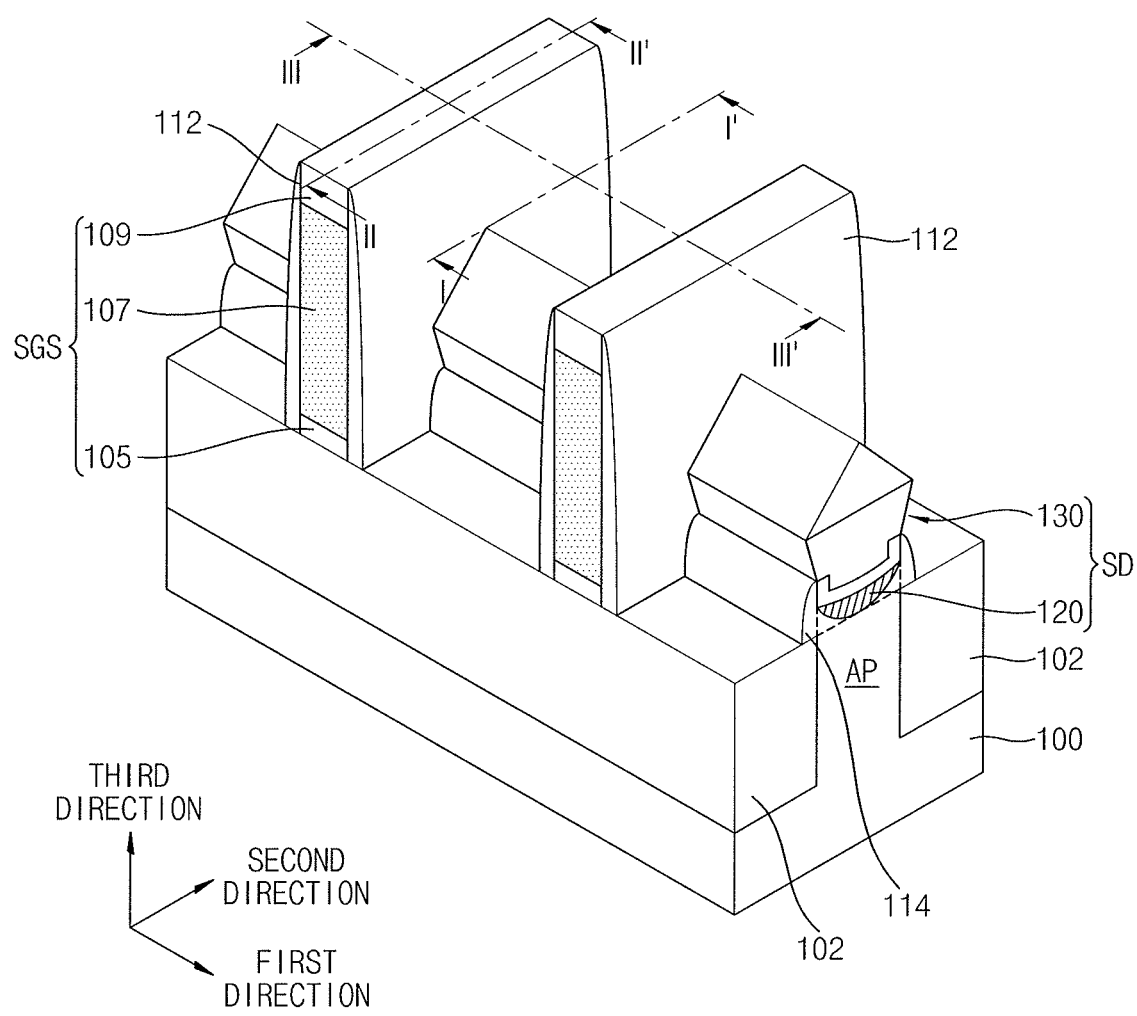
Figure 8B:
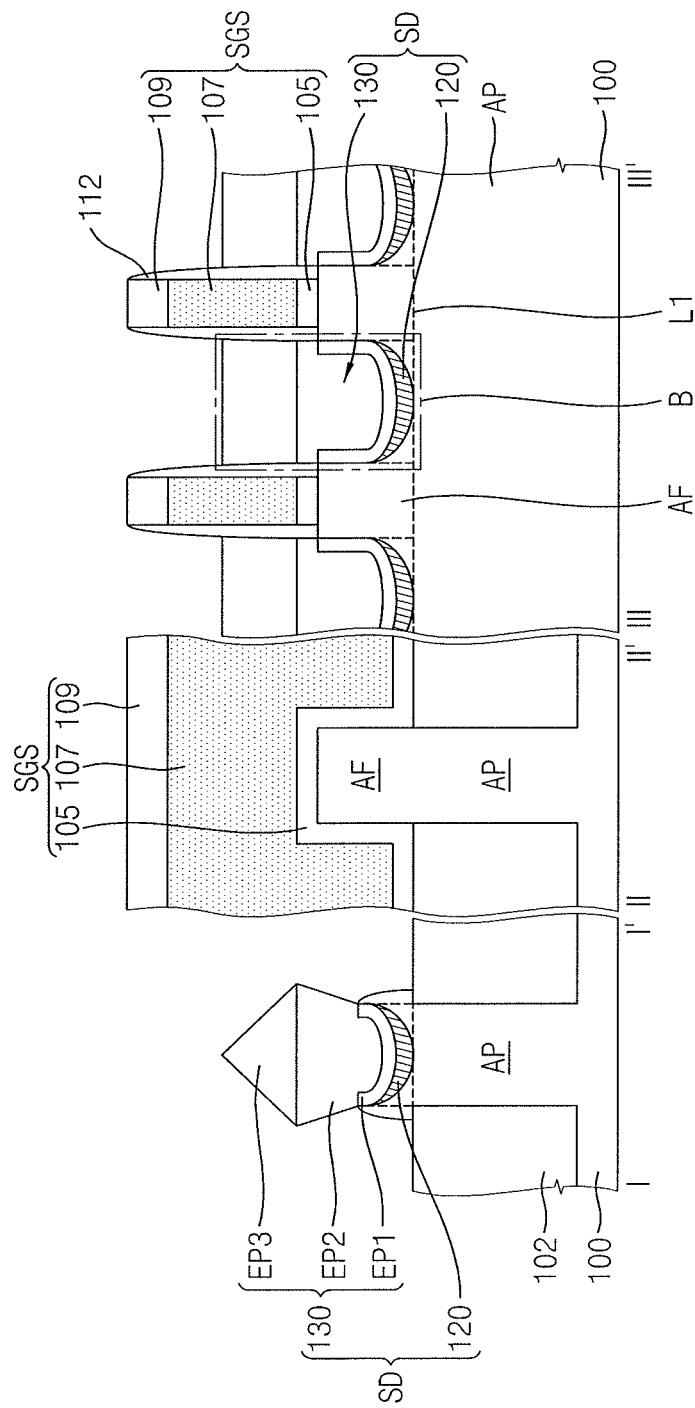
Figure 8C:
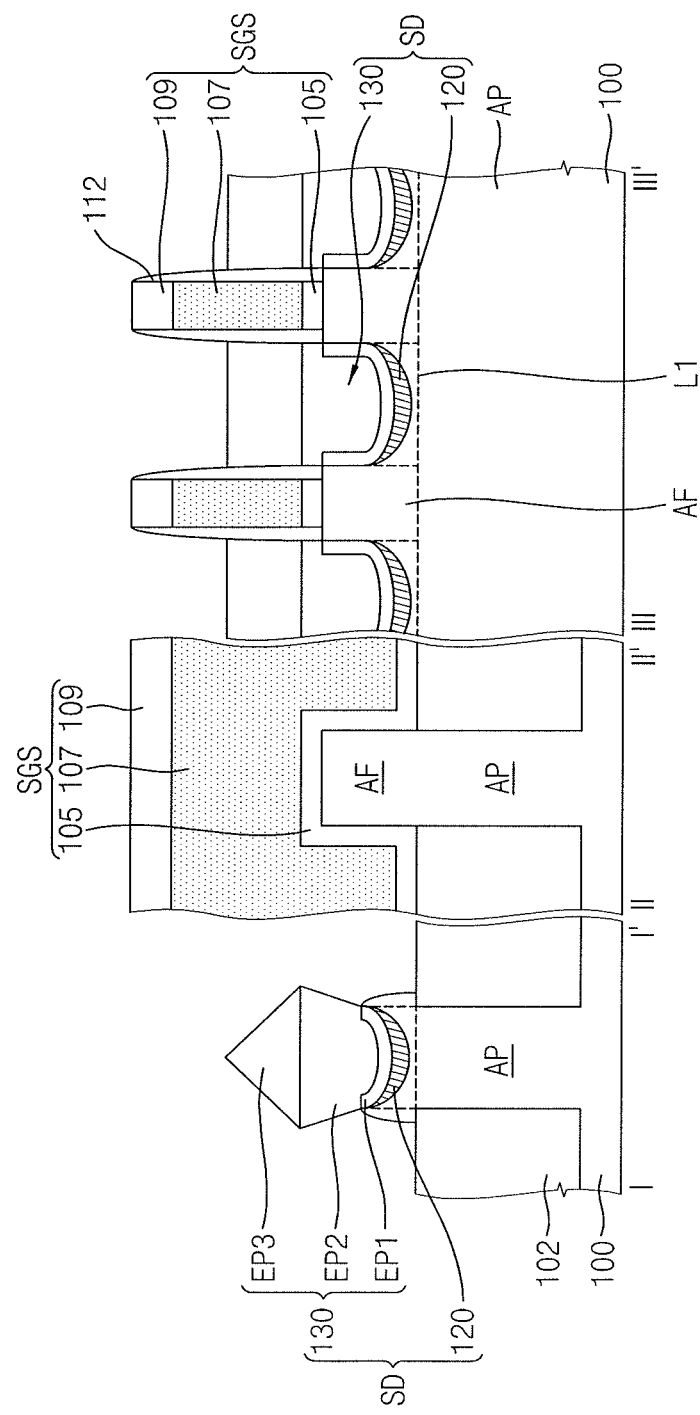

As shown in FIG. 8C, when the bottom surfaces of the recessed regions 116 are located at a higher level than the interface L1 between the active pattern AP and active fin AF, a concentration of an impurity with which the high concentration doped layer 120 is doped may be adjusted. In this case, the concentration of the impurity with which the high concentration doped layer 120 shown in FIG. 8C is doped may be lower than the concentration of the impurity with which the high concentration doped layer 120 shown in FIG. 8B is doped.

Figure 8D:
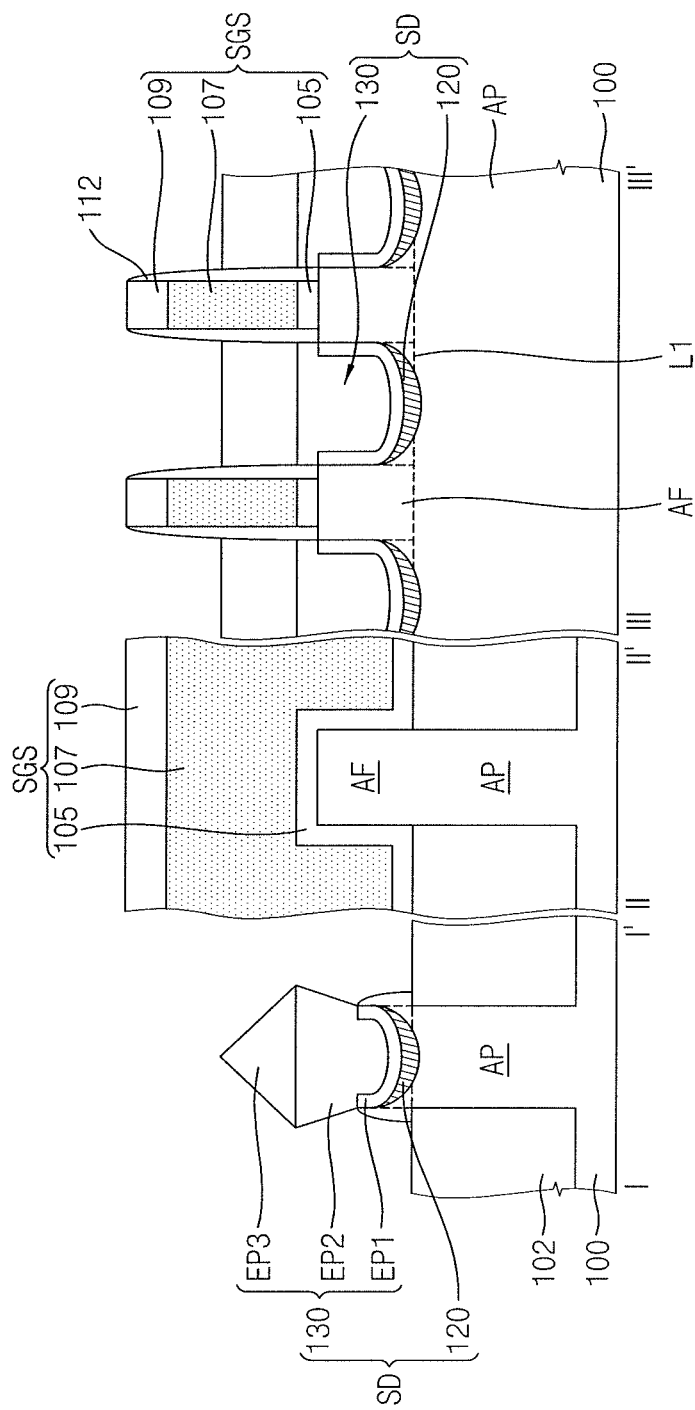
Figure 9:
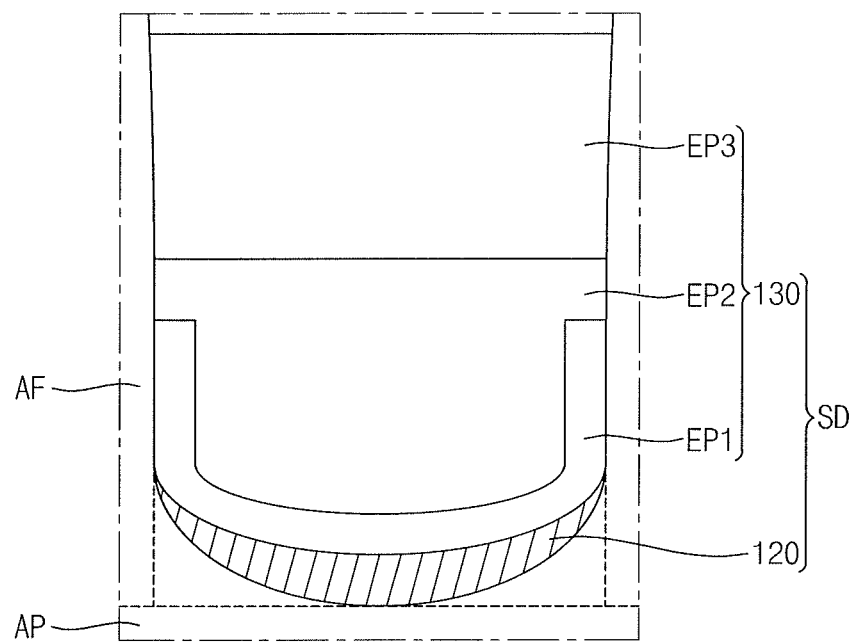

As shown in FIG. 8D, when the bottom surfaces of the recessed regions 116 are located at a lower level than the interface L1 between the active pattern AP and active fin AF, the concentration of the impurity with which the high concentration doped layer 120 is doped may be adjusted. In this case, the concentration of the impurity with which the high concentration doped layer 120 shown in FIG. 8D is doped may be higher than the concentration of the impurity with which the high concentration doped layer 120 shown in FIG. 8B is doped.

Subsequently, the source/drain epitaxial layer 130 may be formed to cover an upper portion of the high concentration doped layer 120. The source/drain epitaxial layer 130 may have a structure in which a plurality of epitaxial layers EP1 to EP3 are sequentially stacked. The plurality of epitaxial layers EP1 to EP3 may include a semiconductor material having a lattice constant that is different from that of the substrate 100, and may be doped with a second conductivity type impurity different from the first conductivity type impurity.

The source/drain epitaxial layer 130 may be formed to cover the high concentration doped layer 120 by performing a selective epitaxial growth process using the active pattern AP exposed by the recessed region 116 as a seed layer. That is, the source/drain epitaxial layer 130 may be formed by performing a selective epitaxial growth process using the sidewalls of the active fins AF which defines the recessed region 116 and the upper surface of the active pattern AP between the sidewalls as seed layers. The source/drain epitaxial layer 130 may include a semiconductor material having a lattice constant different from that of the substrate 100 and a plurality of epitaxial layers may be provided.

In an implementation, the source/drain epitaxial layer 130 may include the first to third epitaxial layers EP1 to EP3 to be sequentially formed. A first epitaxial layer EP1 may be formed as an epitaxial layer including a low concentration semiconductor material. The first epitaxial layer EP1 may be doped with a low concentration second conductivity type impurity by an in-situ method. For example, the first epitaxial layer EP1 may be formed as a silicon-germanium layer which is doped with carbon (C) or boron (B) by an in-situ method. In this case, a germanium concentration of the first epitaxial layer EP1 may be less than 30 atom %, and a concentration of carbon or boron with which the first epitaxial layer EP1 is doped may range from $1\times10^{18}$ to $1\times10^{19}$ atom/cm$^3$. The first epitaxial layer EP1 may be formed by performing a first selective epitaxial growth process using the active pattern AP exposed by the recessed region 116 as a seed layer. In an implementation, the first selective epitaxial growth process may be performed under a pressure condition higher than that in a selective epitaxial growth process for forming second and third epitaxial layers EP2 and EP3, which will be described below. For example, the first selective epitaxial growth process may be performed under a pressure condition of 50 Torr to 300 Torr. Accordingly, the first epitaxial layer EP1 may be substantially and conformally formed on an inner surface of the recessed region 116. The first epitaxial layer EP1 may be formed in the recessed region 116 to cover the high concentration doped layer 120 and the sidewall of the recessed region 116. A bottom of the first epitaxial layer EP1 may have a first thickness and a side surface of the first epitaxial layer EP1 may be formed to have a thickness smaller than the first thickness.

Subsequently, the second epitaxial layer EP2 may be formed as an epitaxial layer including a high concentration semiconductor material. The second epitaxial layer EP2 may be doped with a high concentration second conductivity type impurity by an in-situ method. For example, the second epitaxial layer EP2 may be formed as a silicon-germanium layer which is doped with boron by an in-situ method. In this case, a germanium concentration of the second epitaxial layer EP2 may range from 30 to 70 atom %, and a concentration of carbon or boron with which the second epitaxial layer EP2 is doped may range from $1\times1021$ to $1\times10^{23}$ atom/cm$^3$. The second epitaxial layer EP2 may be formed by performing a second selective epitaxial growth process using the first epitaxial layer EP1 as a seed layer. The second selective epitaxial growth process may be performed under a pressure condition lower than that in the first selective epitaxial growth process. For example, the second selective epitaxial growth process may be performed under a pressure condition of 10 Torr to 30 Torr. As a result, a bottom of the second epitaxial layer EP2 may be formed to have a second thickness that is greater than that of the bottom of the first epitaxial layer EP1. A side surface of the second epitaxial layer EP2 may be formed to have a thickness greater than that of the side surface of the first epitaxial layer EP1.

Subsequently, the third epitaxial layer EP3 may be formed as an epitaxial layer including a high concentration semiconductor material and may be doped with a second conductivity type impurity having a concentration which is higher than that of the first epitaxial layer EP1 and lower than that of the second epitaxial layer EP2. For example, the third epitaxial layer EP3 may be formed as a silicon-germanium layer which is doped with boron by an in-situ method. In this case, a germanium concentration of the third epitaxial layer EP3 may range from 30 to 70 atom %, and a concentration of boron with which the third epitaxial layer EP3 is doped may range from $1\times10^{20}$ to $1\times10^{21}$ atom/cm$^3$. The third epitaxial layer EP3 may be formed by performing a third selective epitaxial growth process using the second epitaxial layer EP2 as a seed layer. The third selective epitaxial growth process may be performed under a pressure condition of 10 Torr to 100 Torr.

In an implementation, the third epitaxial layer EP3 may be formed as an epitaxial layer including a high concentration semiconductor material and may be doped with a second conductivity type impurity having a concentration which is higher than that of each of the first and second epitaxial layers EP1 and EP2.

The first to third selective epitaxial growth processes described above may be consecutively performed in the same chamber. The source/drain epitaxial layer 130 and the high concentration doped layer 120 described above may constitute a source/drain region SD of a three-dimensional FinFET.

According to the example embodiment, the high concentration doped layer 120 may be disposed on the lower end portion of the recessed region 116, and the source/drain region SD having a U-shaped cross section (e.g., having a rounded lower end) may be electrically formed by adjusting the concentration of the impurity with which the high concentration doped layer 120 is doped. For example, lengths of electrical channels between the top and bottom regions of the source/drain region SD may be constantly formed or may be uniform by disposing the high concentration doped layer 120 at the lower end portion of the recessed region 116. Further, the source/drain epitaxial layer 130 may be disposed above the high concentration doped layer 120 and the concentration of the impurity with which the source/drain epitaxial layer 130 is doped may be adjusted. The lengths of the channels between the top and bottom regions of the source/drain region SD may be constantly formed or may be uniform. Accordingly, the electrical characteristics of the semiconductor device may be improved by electrically realizing a U-shaped junction profile.

Figure 10A:
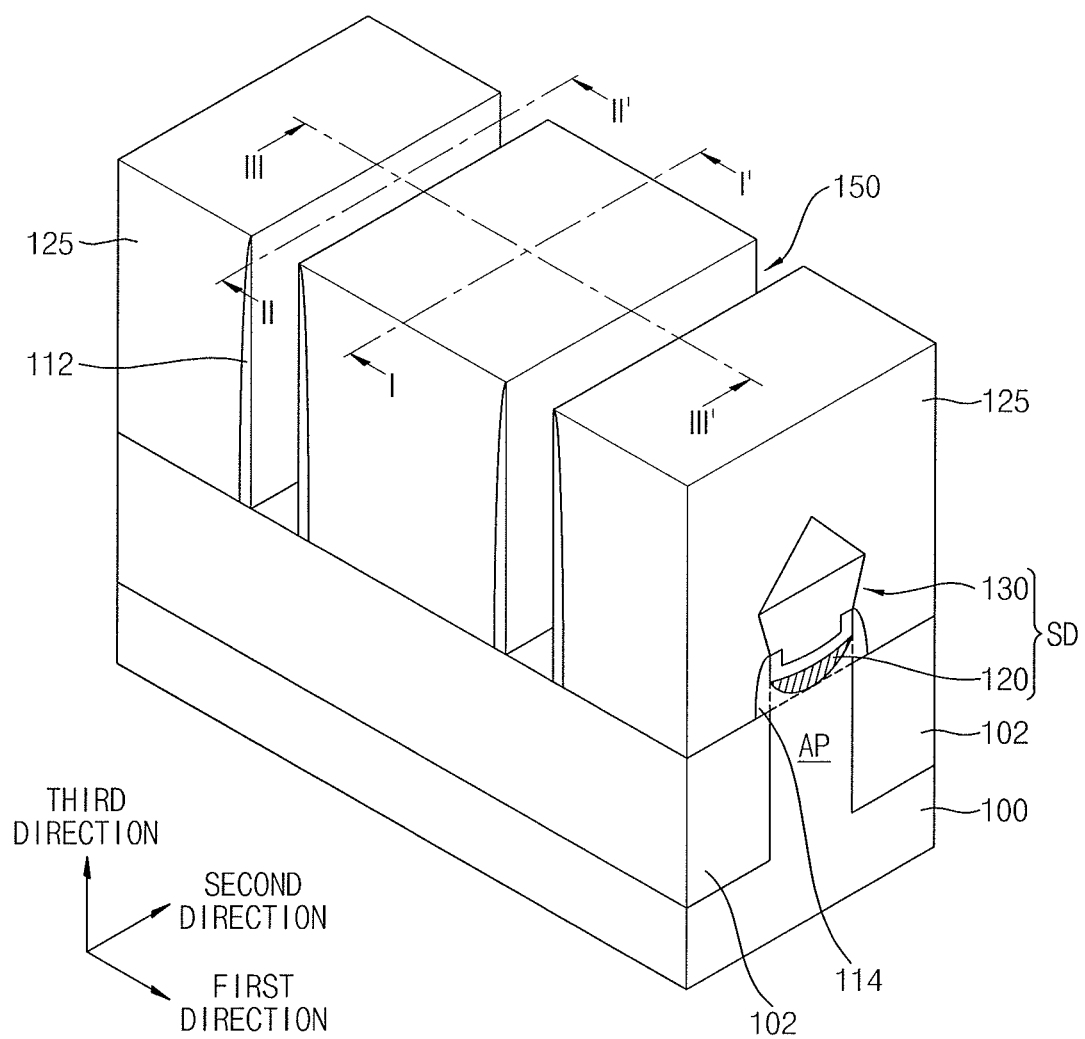
Figure 10B:
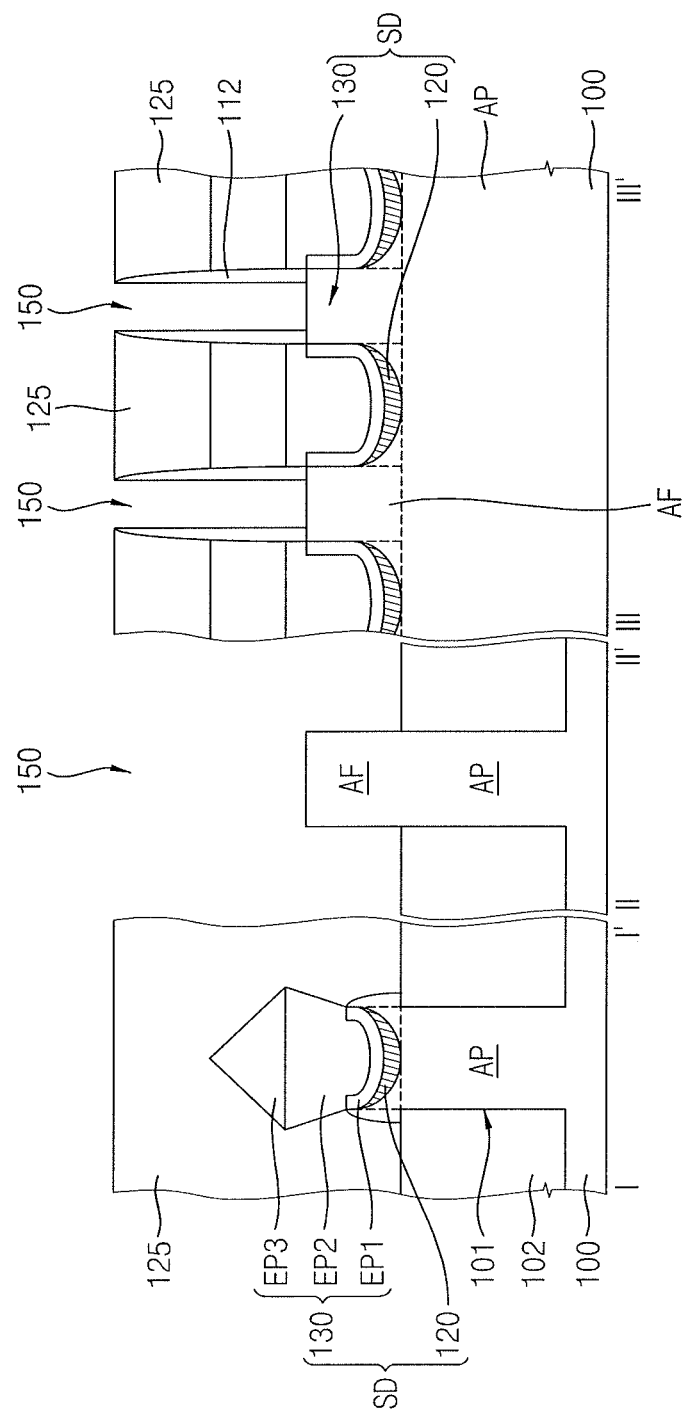

Referring to FIGS. 10A and 10B, a lower interlayer insulating film 125 may be formed on the substrate 100 in which the source/drain regions SD are formed. The lower interlayer insulating film 125 may be formed to cover the source/drain regions SD and the sacrificial gate structure SGS. The lower interlayer insulating film 125 may include at least one of a silicon oxide film, a silicon nitride film, a silicon oxynitride film, and a low dielectric film. Subsequently, a process of planarizing the lower interlayer insulating film 125 may be performed until the upper surfaces of sacrificial gate patterns 107 (see FIGS. 8A and 8B) are exposed. The planarization process may include an etch-back process and/or a CMP process. The sacrificial gate patterns 107 and the etch stop patterns 105 shown in FIGS. 9A and 9B may be removed. Accordingly, gap regions 150 may be formed to expose the active fin AF between the gate spacers 112. The gap regions 150 may extend in the second direction D2. The gap regions 150 may be formed by performing an etching process for selective removal of the sacrificial gate patterns 107 and the etch stop patterns 105 shown in FIGS. 8A and 8B.

Referring to the drawings in conjunction with FIGS. 1 and 2, a gate dielectric pattern 135 and a gate electrode 140 may be sequentially formed in the gap regions 150. First, a gate dielectric film may be entirely formed on the substrate 100 in which the gap regions 150 are formed. The gate dielectric film may be conformally formed so as not to entirely fill the gap region 150. For example, the gate dielectric film may cover the active fin AF and may extend to sidewalls of the gate spacers 112 and an upper surface of the lower interlayer insulating film 125, which are exposed by the gap regions 150. In an implementation, the gate dielectric film may be formed of a high dielectric material having a higher dielectric constant than a silicon oxide film. For example, the gate dielectric film may include at least one of hafnium oxide, hafnium silicate, zirconium oxide, and zirconium silicate. The gate dielectric film may be formed by performing a CVD process or an ALD process.

Subsequently, a gate electrode film which fills the gap regions 150 may be formed on the gate dielectric film, and a process of planarizing the gate electrode film and the gate dielectric film may be performed so that the upper surface of the lower interlayer insulating film 125 is exposed. As a result, the gate dielectric pattern 135 and the gate electrode 140 may be locally formed in the gap region 150. The gate dielectric pattern 135 and the gate electrode 140 may extend in the second direction D2. In an implementation, the gate electrode film may include at least one metal layer. In an implementation, the gate electrode film may include at least one of titanium, tungsten, tantalum, and aluminum. In an implementation, the gate electrode film may include a conductive metal nitride (e.g., titanium nitride, tantalum nitride, etc.) and a metal (e.g., aluminum, tungsten, etc.), which are sequentially stacked. The gate electrode 140, the gate spacer 112, and the gate dielectric pattern 135 described above may constitute the gate structure GS.

In an implementation, an upper interlayer insulating film may be formed on the substrate 100 including the gate structures GS.

The upper interlayer insulating film may include oxide, nitride, and/or oxynitride. Subsequently, contact holes may be formed to pass through the upper interlayer insulating film and the lower interlayer insulating film 125 and expose the source/drain regions SD. Contact plugs may be formed in each of the contact holes. In addition, interconnections connected to each of the contact plugs may be formed on the upper interlayer insulating film. The interconnections may be electrically connected to each of the source/drain regions SD through the contact plugs. The contact plugs and the interconnections may include a conductive material.

Figure 11:
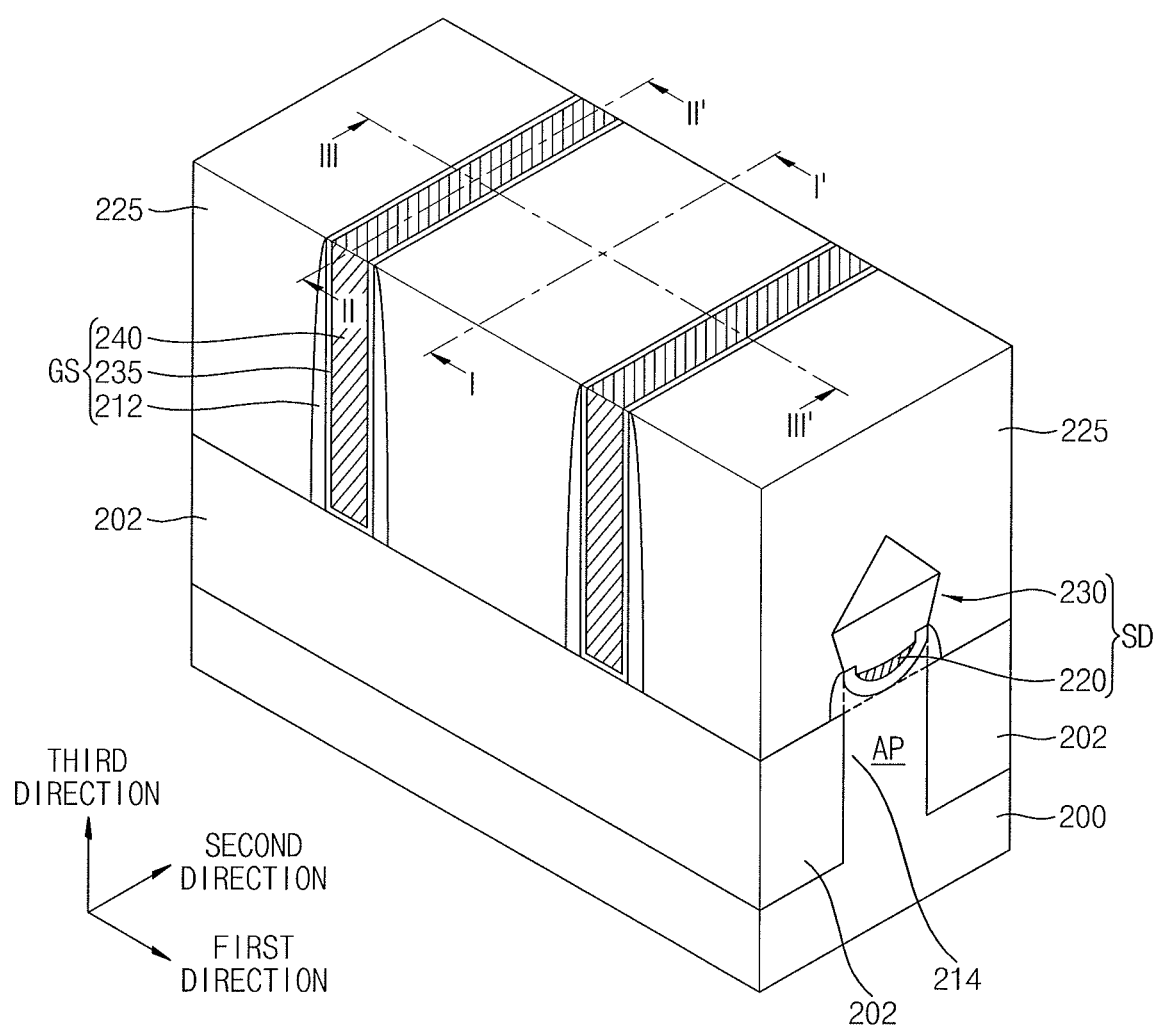
FIG. 11 illustrates a perspective view showing a structure of a FinFET according to an example embodiment.
Figure 12:
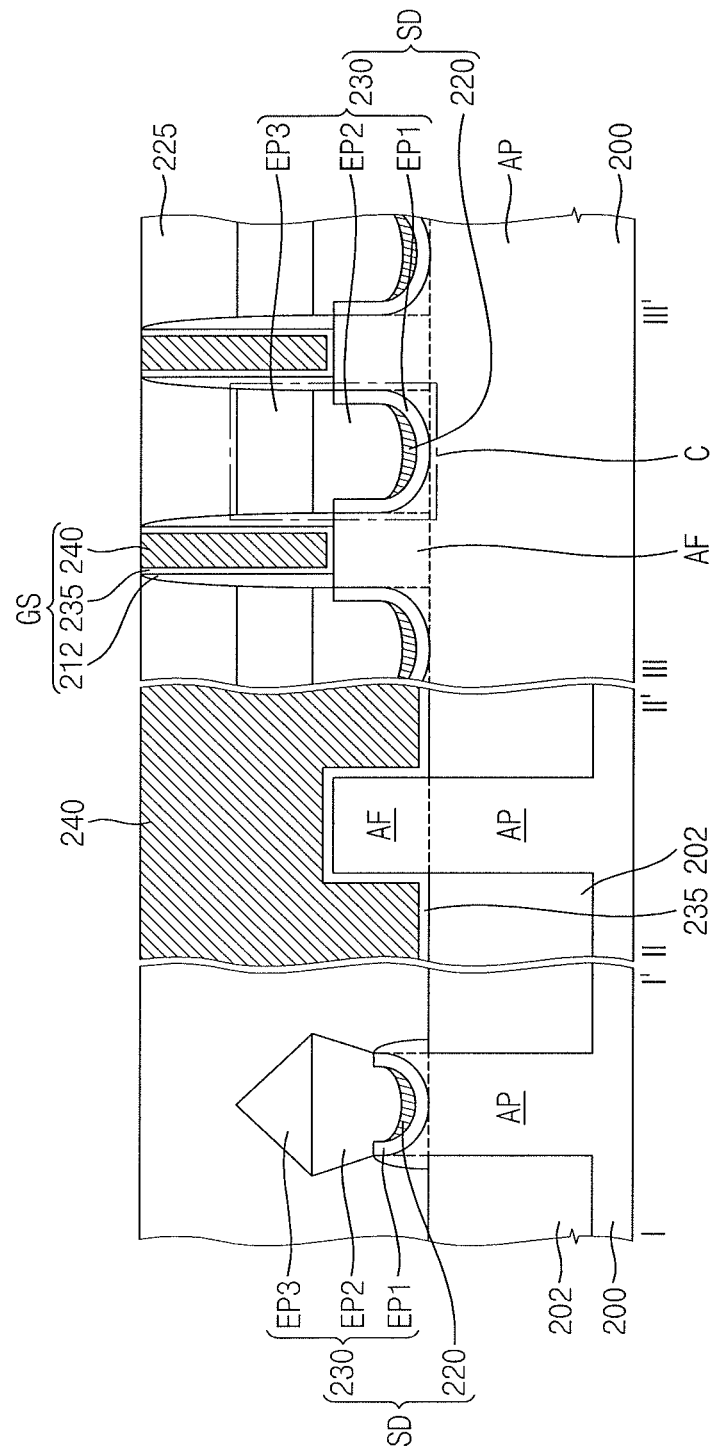
FIG. 12 illustrates a cross-sectional view taken along lines I-I', II-II', and III-III' of FIG. 11.
Figure 13:
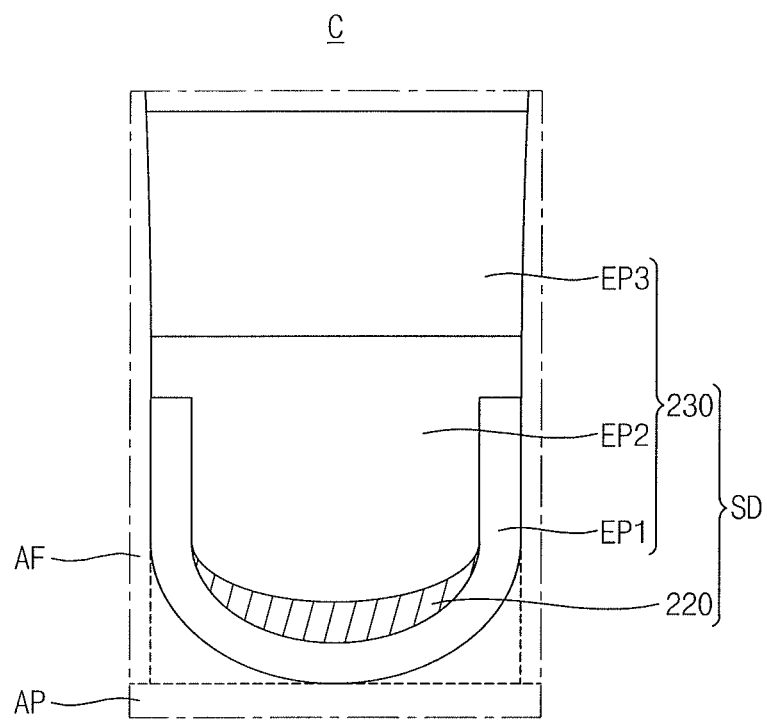
FIG. 13 illustrates an enlarged view of a portion C shown in FIG. 12.

FIG. 11 illustrates a perspective view showing a structure of a FinFET according to an example embodiment. FIG. 12 illustrates a cross-sectional view taken along lines I-I', II-II', and III-III' shown in FIG. 11. FIG. 13 illustrates an enlarged view of a portion C shown in FIG. 12.

In a semiconductor device including the FinFET according to the example embodiment shown in FIGS. 11 and 12, configurations excluding a high concentration doped layer 220 and a source/drain region 230 may be similar to or the same as those of the semiconductor device described with reference to FIGS. 1 to 3. In describing the semiconductor device including the FinFET according to the example embodiment with reference to FIGS. 11 to 13, detailed descriptions of the similar or same configurations as those of the semiconductor device described with reference to FIGS. 1 to 3 may be omitted.

Referring to FIGS. 11 to 13, the semiconductor device including the FinFET according to the example embodiment may include a substrate 200, an active pattern AP formed on the substrate 200, a gate structure GS in which a gate electrode 240 is formed, and the source/drain region 230 in which the high concentration doped layer 220 is formed.

The active pattern AP may be formed to protrude from an upper surface of the substrate 200. The active pattern AP may be disposed on the upper surface of the substrate 200 in the form of a bar extending in a first direction. The active pattern AP may be a portion of the substrate 200 or may include an epitaxial layer grown from the substrate 200. The active pattern AP may be doped with a first conductivity type impurity.

Device isolation patterns 202 may be disposed at both sides of the active pattern AP. The device isolation patterns 202 may be disposed to surround sidewalls of the active pattern AP and may separate active patterns AP of FinFETs from each other. In this case, the device isolation patterns 202 may cover portions of the sidewalls of the active pattern AP.

The gate structure GS crossing the active pattern AP may be disposed on the substrate 200. The gate structure GS may be formed to cross the active pattern AP and may cover an upper surface and side surfaces of the active fin AF.

The gate structure GS may include the gate electrode 240, a gate dielectric pattern 235, and gate spacers 212. The gate electrode 240 may be disposed to cross the active pattern AP. The gate spacers 212 may be disposed on both sidewalls of the gate electrode 240. The gate dielectric pattern 235 may be disposed between the gate spacer 212 and gate electrode 240. A plurality of gate structures GS may be provided, and the plurality of gate structures GS may cross at least one active pattern AP.

Recessed regions 216 (see FIGS. 14A and 14B) may be provided on the active patterns AP formed at both sides of the gate structure GS. Here, the recessed region 216 may be defined in a space between the active fins AF which are locally disposed below the gate structures GS. The recessed region 216 may be formed to have a U shape having a lower portion narrower than an upper portion. The high concentration doped layer 220 and a source/drain epitaxial layer 230 may be disposed inside each of the recessed regions 216 to form a source/drain region SD.

The source/drain epitaxial layer 230 may have a structure in which a plurality of epitaxial layers EP1 to EP3 are stacked. The plurality of epitaxial layers EP1 to EP3 may include a semiconductor material having a lattice constant different from that of the substrate 200, and may be doped with a second conductivity type impurity different from the first conductivity type impurity. The high concentration doped layer 220 may be disposed between a first epitaxial layer EP1 and a second epitaxial layer EP2, or between the second epitaxial layer EP2 and a third epitaxial layer EP3.

For example, the first epitaxial layer EP1 may be disposed on or at a lower end portion of the recessed region 216 and the high concentration doped layer 220 may be disposed to cover an upper surface of a bottom of the first epitaxial layer EP1 (e.g., cover an inner, bottom end of the U-shaped first epitaxial layer EP1. The second epitaxial layer EP2 may be disposed to cover the high concentration doped layer 220 and the third epitaxial layer EP3 may be disposed to cover the second epitaxial layer EP2.

The first epitaxial layer EP1 may be disposed inside the recessed region 216. For example, the first epitaxial layer EP1 may be in contact with sidewalls and a bottom or inner surface of the recessed region 216. The first epitaxial layer EP1 may have a bottom surface having a first thickness that serves as a buffer layer. The bottom of the first epitaxial layer EP1 may be thicker than the high concentration doped layer 220. The first epitaxial layer EP1 may include a low concentration silicon-germanium layer. A germanium concentration of the first epitaxial layer EP1 may range from 10 to 30 atom %. The first epitaxial layer EP1 may be doped with carbon (C) or boron (B) at a low concentration.

The high concentration doped layer 220 may be formed to have a predetermined height (e.g., 1 to 10 nm) from the upper surface of the bottom or lower end of the first epitaxial layer EP1. Silicon (Si), silicon-germanium (SiGe), or germanium (Ge) may be grown inside the recessed region 216 in an epitaxial manner to have a thickness of 1 to 10 nm to form an epitaxial layer. Then, the epitaxial layer may be doped with the first conductivity type impurity to form the high concentration doped layer 220. The high concentration doped layer 220 may be formed to cover the upper surface of the bottom of the first epitaxial layer EP1.

The high concentration doped layer 220 may have a predetermined thickness, the high concentration doped layer 220 may be in contact with a portion of the sidewall of the first epitaxial layer EP1, and may not be formed to fully cover the sidewall of the first epitaxial layer EP1. The high concentration doped layer 220 may be formed to fully cover the upper surface of the bottom of the first epitaxial layer EP1 and may be formed to cover only a portion of the sidewall of the first epitaxial layer EP1. Therefore, the high concentration doped layer 220 may be in contact with the entire upper surface of the bottom of the first epitaxial layer EP1 to cover a first area. The high concentration doped layer 220 may be in contact with only a portion of the sidewall of the first epitaxial layer EP1 to cover a second area. In this case, the first area of the high concentration doped layer 220 in contact with the upper surface of the bottom of the first epitaxial layer EP1 may be greater than the second area of the high concentration doped layer 220 in contact with the sidewall of the first epitaxial layer EP1.

The upper surface of the bottom of the first epitaxial layer EP1 may be in contact with the high concentration doped layer 220, and the sidewall of the first epitaxial layer EP1 may be in contact with the second epitaxial layer EP2. For example, the silicon-germanium layer (the epitaxial layer) may be doped with at least one of phosphorus (P), carbon (C), boron (B), tin (Sn), gallium (Ga), and arsenic (As) at a high concentration to form the high concentration doped layer 220. Carbon (C) may be doped along with another dopant. A junction may be formed at an interface between the high concentration doped layer 220 and the first epitaxial layer EP1. A junction may be formed at an interface between the high concentration doped layer 220 and the second epitaxial layer EP2.

For example, the epitaxial layer may be grown with at least one gas of dichlorosilane (DCS), $SiH_4$, $Si_2H_6$, $GeH_4$, $B_2H_6$, and +HCl and doped with boron (B) to form a high concentration SiGe:B doped layer 220. In this case, a concentration of germanium (Ge) may range from 10 to 50 atom %, and a concentration of boron (B) may range from $1 \times 10^{18}$ to $1 \times 10^{21}$ atom/cm$^3$. When the epitaxial layer is doped with carbon (C), tin (Sn), gallium (Ga), or arsenic (As), a concentration of an impurity may range from $1 \times 10^{18}$ to $1 \times 10^{21}$ atom/cm$^3$.

The second epitaxial layer EP2 may cover the high concentration doped layer 220, and the third epitaxial layer EP3 may be disposed on the second epitaxial layer EP2. A bottom of the second epitaxial layer EP2 may be in contact with an upper surface of the high concentration doped layer 220. A sidewall of the second epitaxial layer EP2 may be in contact with the sidewall of the first epitaxial layer EP1. Each of the second and third epitaxial layers EP2 and EP3 may include a silicon-germanium layer. In this case, a germanium concentration of each of the second and third epitaxial layers EP2 and EP3 may be greater than a germanium concentration of the first epitaxial layer EP1. For example, the germanium concentration of each of the second and third epitaxial layers EP2 and EP3 may range from 30 to 70 atom %.

Meanwhile, a concentration of the second conductivity type impurity with which the second and third epitaxial layers EP2 and EP3 are doped may be greater than a concentration of an impurity with which the first epitaxial layer EP1 is doped. The concentration of the second conductivity type impurity with which the second and third epitaxial layers EP2 and EP3 are doped may be smaller than a concentration of an impurity with which the high concentration doped layer 220 is doped. The second and third epitaxial layers EP2 and EP3 may be doped with carbon (C) or boron (B). In an implementation, the concentration of the second conductivity type impurity with which the second epitaxial layer EP2 is doped may be greater than a concentration of an impurity with which the third epitaxial layer EP3 is doped. For example, when the first to third epitaxial layers EP1 to EP3 are doped with boron, a concentration of boron with which the second epitaxial layer EP2 is doped may range from $1\times10^{21}$ to $5\times10^{21}$ atom/cm$^3$. A concentration of boron with which the first epitaxial layer EP1 is doped may range from $1\times10^{18}$ to $1\times10^{19}$ atom/cm$^3$. In this case, a concentration of boron with which the third epitaxial layer EP3 is doped may be $1\times10^{20}$ atom/cm$^3$ or higher and may be lower than that in the second epitaxial layer EP2. An interface between the second and third epitaxial layers EP2 and EP3 may be located at a level lower than an upper surface of the active fin AF. An uppermost portion of the third epitaxial layer EP3 may be located at a level lower than the upper surface of the active fin AF.

The source/drain epitaxial layer 230 and the high concentration doped layer 220 may constitute a source/drain region SD of a three-dimensional FinFET. A semiconductor device including the high concentration doped layer 220 and the source/drain epitaxial layer 230 may be a PMOS transistor. As the source/drain epitaxial layer 230 includes a material (e.g., silicon germanium) having a lattice constant greater than that of the substrate 200, a compressive force may be provided to the active fin AF. As a result, the mobility of electrons, which are major carriers, may be improved in a channel region of the PMOS transistor. In an implementation, the semiconductor device including the high concentration doped layer 220 and the source/drain epitaxial layer 230 may be an NMOS transistor. In this case, impurities with which the high concentration doped layer 220 and the source/drain epitaxial layer 230 are doped may be different.

A lower interlayer insulating film 225 which covers the source/drain region SD may be disposed on the substrate 200. An upper surface of the lower interlayer insulating film 225 and upper surfaces of the gate structures GS may be substantially coplanar.

According to the example embodiment, the high concentration doped layer 220 may be disposed inside the recessed region 216, and the source/drain region SD having a U-shaped cross section (e.g., rounded bottom) may be electrically formed by adjusting the concentration of the impurity with which the high concentration doped layer 220 is doped. For example, the recessed region 216 may have a shape in which a physical width of a top region of the source/drain region SD is wide and a physical width of a bottom region is narrow. However, lengths of electrical channels between top and bottom regions of the source/drain region SD may be constantly formed or may be uniform by disposing the high concentration doped layer 220 inside the recessed region 216. For example, although physical widths of the top and bottom regions of the source/drain region SD may be different, the lengths of the electrical channels between the top and bottom regions of the source/drain region SD may be constantly formed or may be uniform by or due to the high concentration doped layer 220. Accordingly, the electrical characteristics of the semiconductor device may be improved by electrically realizing a U-shaped junction profile.

FIGS. 14A to 16 illustrate stages in a method of manufacturing a semiconductor device according to an example embodiment.

Before the description with reference to the drawings, in the semiconductor device including the FinFET according to the example embodiment shown in FIGS. 11 to 13, configurations excluding the high concentration doped layer 220 and the source/drain region 230 may be similar to or the same as those of the semiconductor device described with reference to FIGS. 1 to 3. Therefore, in describing the method of manufacturing the semiconductor device including the FinFET according to the example embodiment with reference to FIGS. 14A to 16, detailed descriptions of the similar or same configurations as those in the method of manufacturing the semiconductor device described with reference to FIGS. 4 to 10B may be omitted.

Figure 14A:
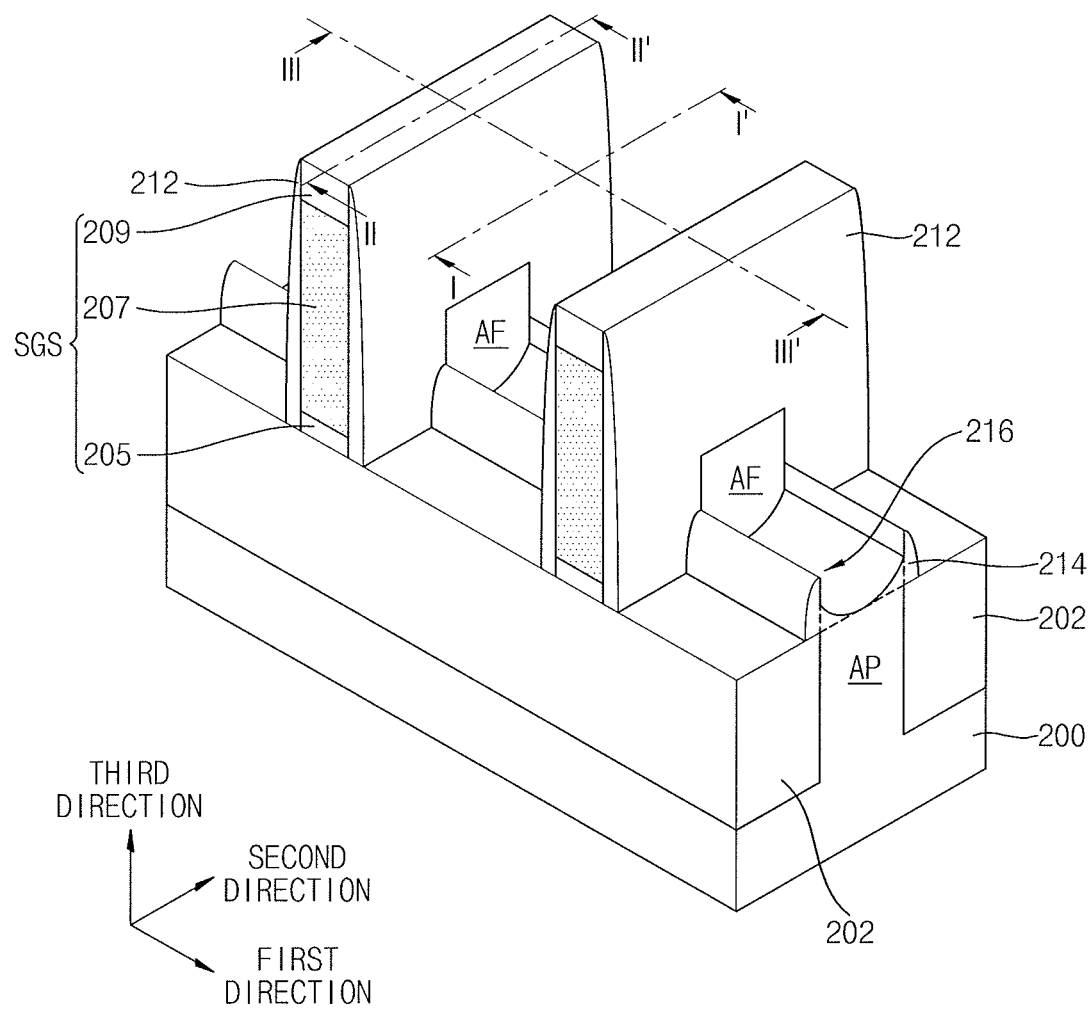
FIGS. 14A to 16 illustrate stages in a method of manufacturing a semiconductor device according to an example embodiment.
Figure 14B:
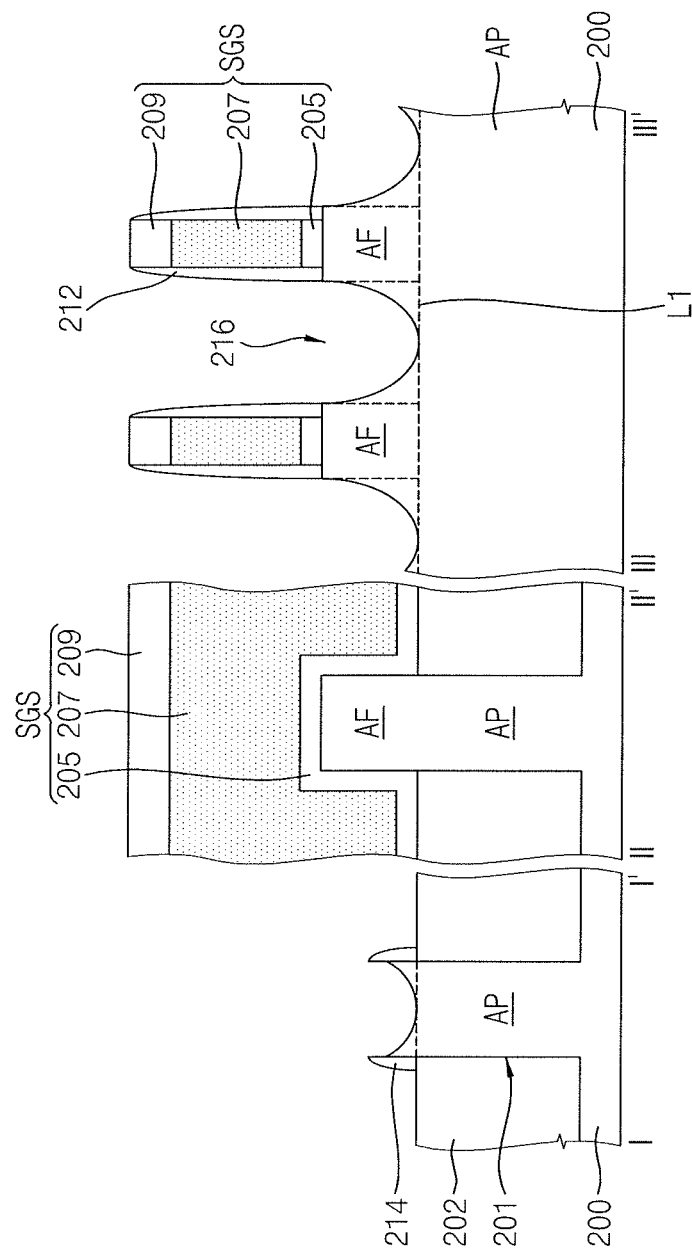

Referring to FIGS. 14A and 14B, portions of the active patterns AP formed at both sides of the sacrificial gate structure SGS may be removed so that recessed regions 216 may be formed. The second regions R2 of the active fin AF may be removed by performing an etching process using the gate mask pattern 209 and the gate spacers 212 as etch masks, and thus the recessed regions 216 may be formed. In this case, bottom surfaces of the recessed regions 216 may be located at the interface L1 between the active pattern AP and active fin AF.

In an implementation, the recessed regions 216 may be formed by sequentially performing an anisotropic etching process and an isotropic etching process. Accordingly, the second regions R2 may be etched in a depth direction by an anisotropic etching process and may be laterally etched toward the active fin AF by an isotropic etching process. A lower portion of the recessed region 216 may have a shape which is tapered downwardly. For example, the recessed region 216 may be formed to have a U-shape in which a width of a lower portion thereof is narrow.

According to the example embodiment, an etching process for forming the recessed region 216 may be performed using an etching condition having a relatively high etch selectivity with respect to the fin spacers 113 (see FIGS. 6A and 6B). While the etching process is performed, an etching amount of the fin spacers 113 may be relatively small. Accordingly, even after the second regions R2 of the active fin AF are removed, portions of the fin spacers 113 may remain on the device isolation patterns 202. That is, portions of the fin spacers 113 may remain so that auxiliary spacers 214 may be formed.

Figure 14C:
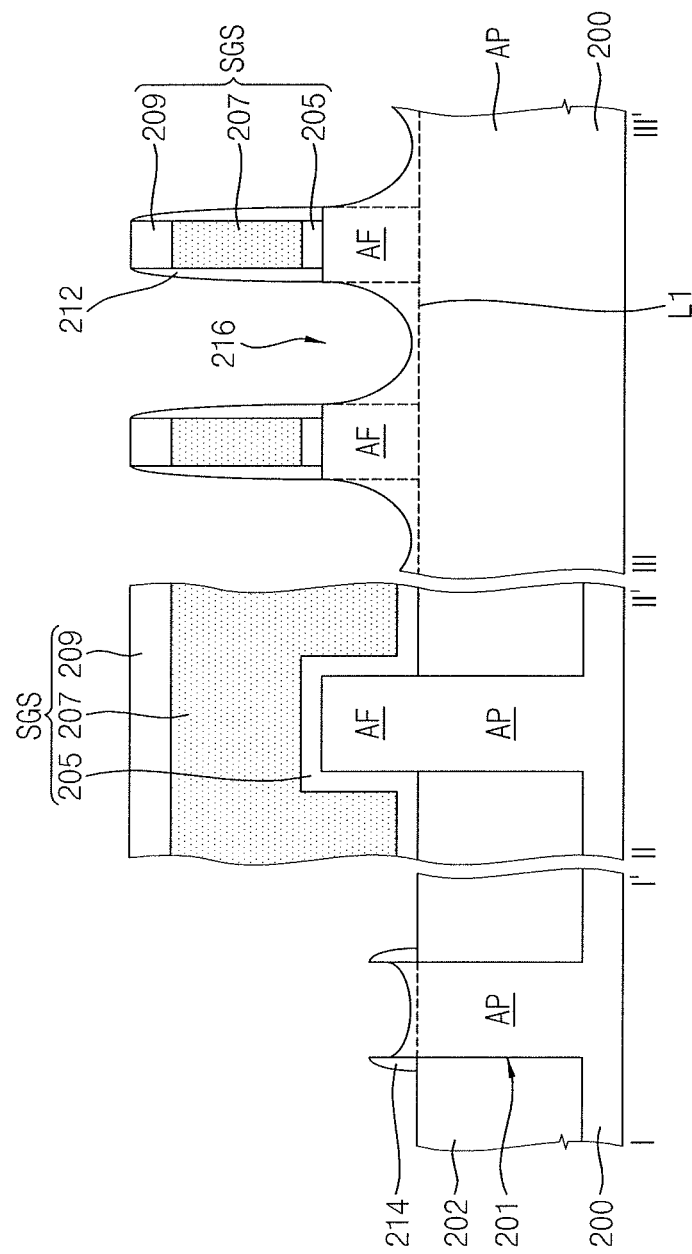
Figure 14D:
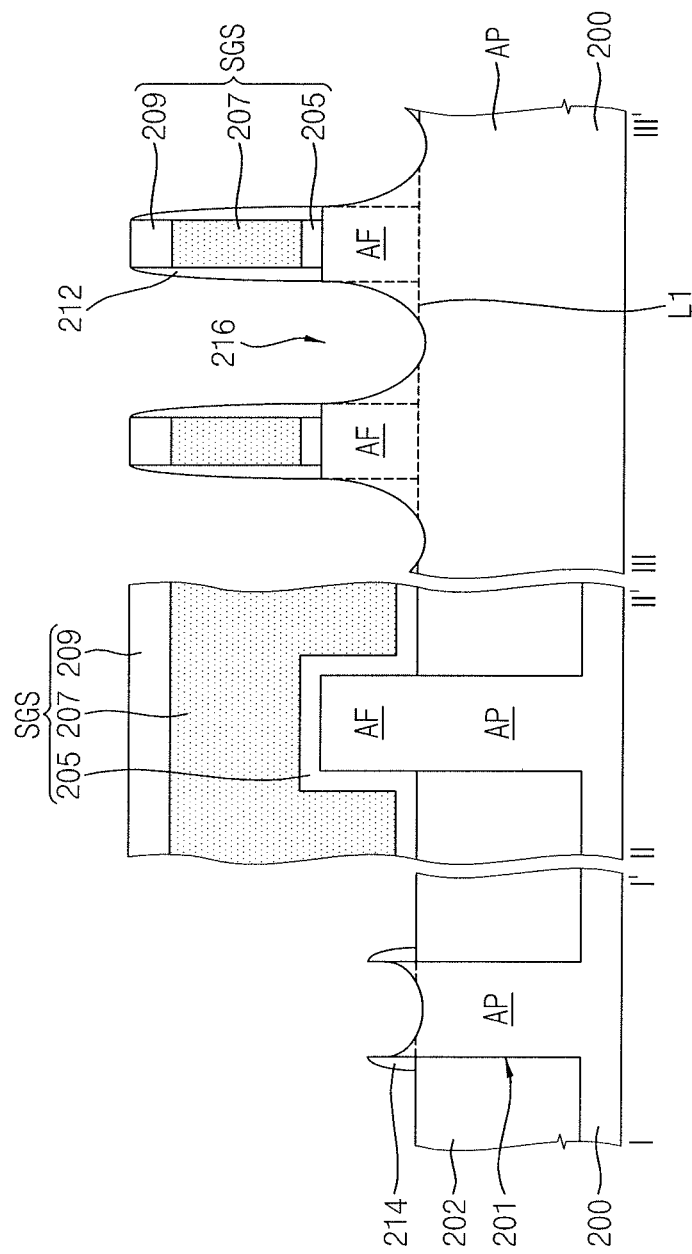

Referring to FIGS. 14C and 14D, depths of the recessed regions 216 may be adjusted according to conditions of the manufacturing process. For example, as shown in FIG. 14C, the depths of the recessed regions 216 may be reduced by reducing an amount of removal of the active pattern AP. In this case, the bottom surfaces of the recessed regions 216 may be located at a higher level than the interface L1 between the active pattern AP and active fin AF. For example, as shown in FIG. 14D, the depths of the recessed regions 216 may be increased by increasing the amount of removal of the active pattern AP. In this case, the bottom surfaces of the recessed regions 216 may be located at a lower level than the interface L1 between the active pattern AP and active fin AF.

Referring to FIGS. 15A to 15D and 16, the first epitaxial layer EP1 of the source/drain epitaxial layer 230 may be formed on an inner bottom surface and the sidewall of the recessed region 216. The first epitaxial layer EP1 may include a semiconductor material having a lattice constant that is different from that of the substrate 200, and may be doped with a second conductivity type impurity that is different from a first conductivity type impurity.

The first epitaxial layer EP1 may be formed by performing a selective epitaxial growth process using the active pattern AP exposed by the recessed region 216 as a seed layer. The first epitaxial layer EP1 may be formed as the epitaxial layer including a low concentration semiconductor material. The first epitaxial layer EP1 may be doped with a low concentration second conductivity type impurity by an in-situ method. For example, the first epitaxial layer EP1 may be formed as a silicon-germanium layer which is doped with carbon (C) or boron (B) by an in-situ method. In this case, a germanium concentration of the first epitaxial layer EP1 may be less than 30 atom %, and a concentration of boron with which the first epitaxial layer EP1 is doped may range from $1\times10^{18}$ to $1\times10^{19}$ atom/cm$^3$. The first epitaxial layer EP1 may be formed by performing a first selective epitaxial growth process using the active pattern AP exposed by the recessed region 216 as a seed layer. In an implementation, the first selective epitaxial growth process may be performed under a pressure condition that is higher than that in a selective epitaxial growth process for forming second and third epitaxial layers EP2 and EP3, which will be described below. For example, the first selective epitaxial growth process may be performed under a pressure condition of 50 Torr to 300 Torr. Accordingly, the first epitaxial layer EP1 may be substantially and conformally formed on an inner surface of the recessed region 216. The first epitaxial layer EP1 may be formed to cover the bottom surface and the sidewall of the recessed region 216. The bottom of the first epitaxial layer EP1 may have a first thickness, and the side surface of the first epitaxial layer EP1 may be formed to have a thickness smaller than the first thickness.

Figure 15A:
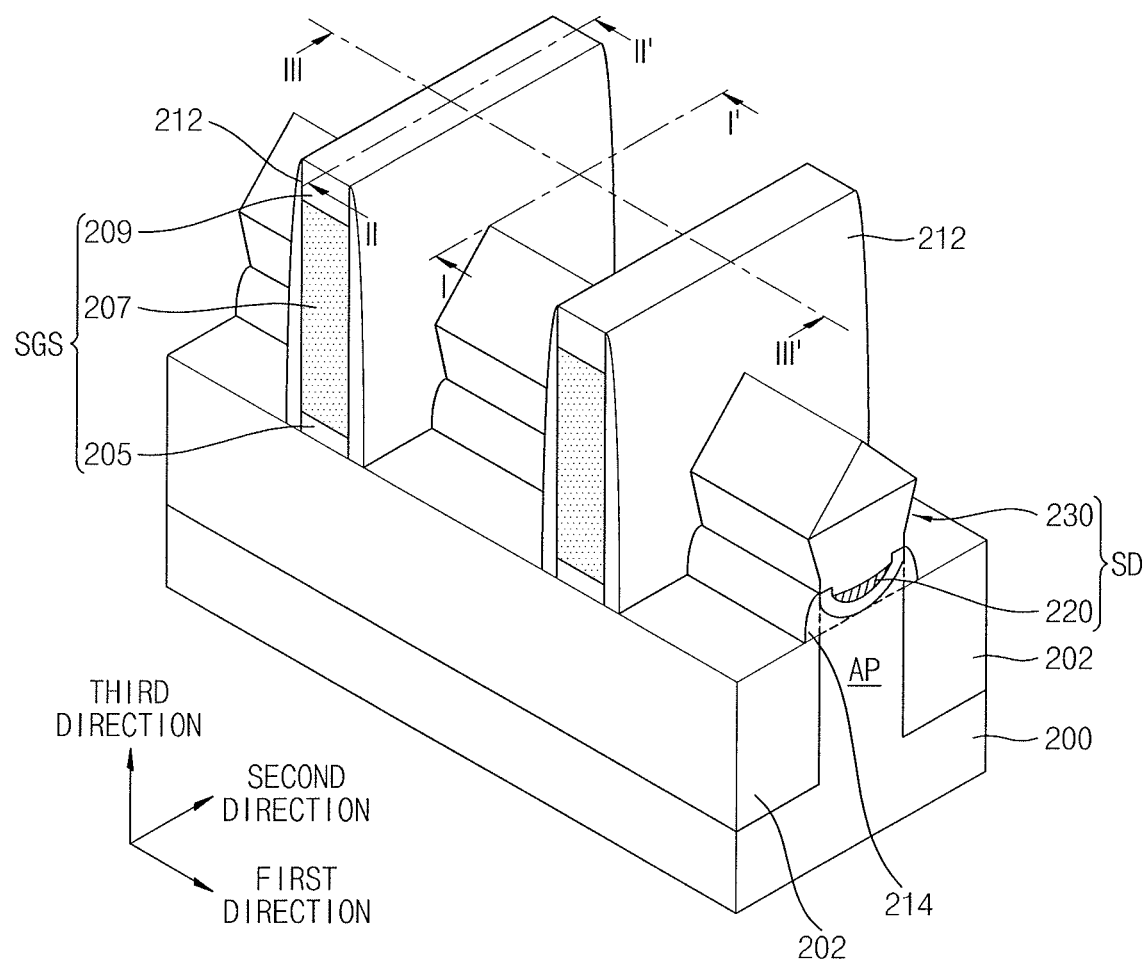
Figure 15B:
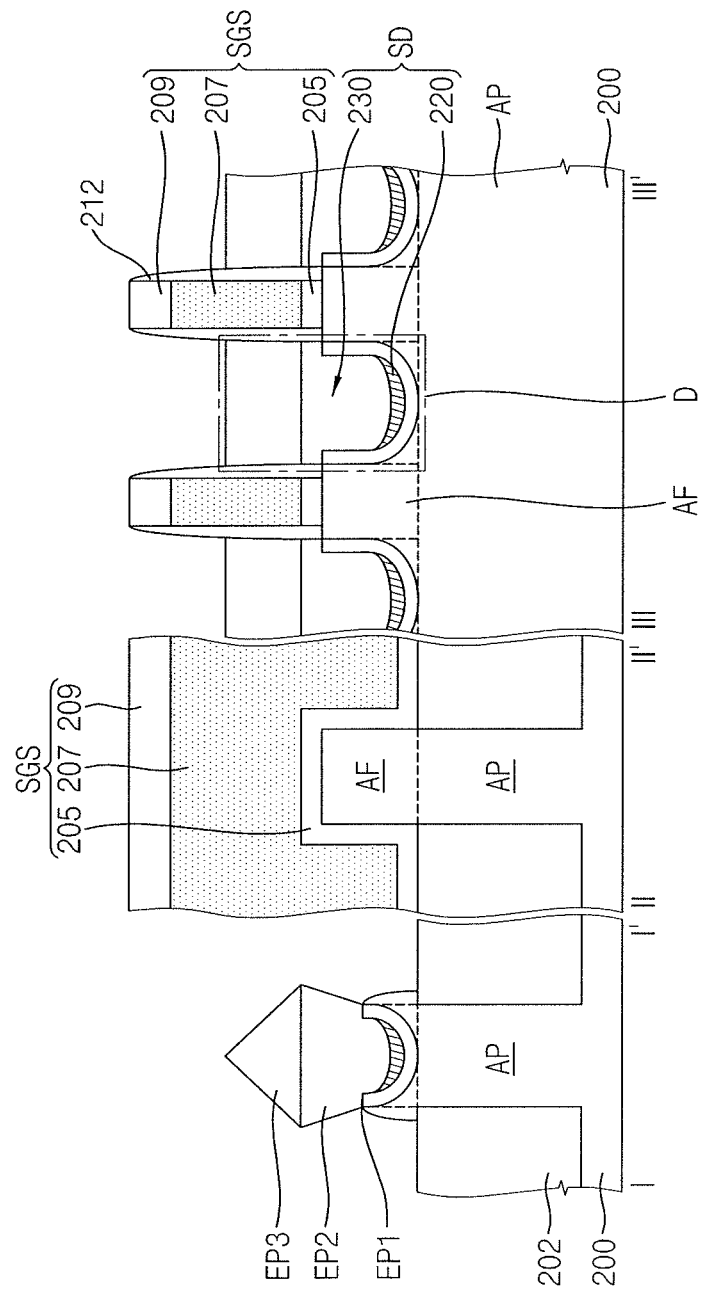

As shown in FIGS. 15A and 15B, the high concentration doped layer 220 may be formed to have a predetermined height (e.g., 1 to 10 nm) from the upper surface of the bottom of the first epitaxial layer EP1. Silicon (Si), silicon-germanium (SiGe), or germanium (Ge) may be grown inside the recessed region 216 in an epitaxial manner to have a thickness of 1 to 10 nm to form a silicon-germanium layer (an epitaxial layer). Subsequently, the silicon-germanium layer (the epitaxial layer) may be doped with an impurity to form the high concentration doped layer 220. The high concentration doped layer 220 may cover the upper surface of the bottom of the first epitaxial layer EP1, and is not formed on the sidewall of the first epitaxial layer EP1. Therefore, the sidewall of the first epitaxial layer EP1 may be in contact with the second epitaxial layer EP2.

The silicon-germanium layer (e.g., the epitaxial layer) may be doped with at least one of phosphorus (P), carbon (C), boron (B), tin (Sn), gallium (Ga), and arsenic (As) at a high concentration to form the high concentration doped layer 220. Carbon (C) may be doped along with another dopant. A junction may be formed at an interface between the high concentration doped layer 220 and the first epitaxial layer EP1. A junction may be formed at an interface between the high concentration doped layer 220 and the second epitaxial layer EP2.

For example, the epitaxial layer may be grown with at least one gas of dichlorosilane (DCS), SiH$_4$, Si$_2$H$_6$, GeH$_4$, B$_2$H$_6$, and +HCl and doped with boron (B) to form a high concentration SiGe:B doped layer 220. In this case, a concentration of germanium (Ge) may range from 10 to 50 atom %, and a concentration of boron (B) may range from $1\times10^{18}$ to $1\times10^{21}$ atom/cm$^3$. When the epitaxial layer is doped with carbon (C), tin (Sn), gallium (Ga), or arsenic (As), a concentration of an impurity may range from $1\times10^{18}$ to $1\times10^{21}$ atom/cm$^3$.

The epitaxial layer may be grown with at least one gas of dichlorosilane (DCS), SiH$_4$, Si$_2$H$_6$, GeH$_4$, B$_2$H$_6$, and +HCl under conditions having a pressure of 10 to 300 Torr and a temperature of 500 to 700° C. and doped with boron (B) to form a high concentration SiGe:B doped layer 220. In this case, a concentration of germanium (Ge) may range from 10 to 50 atom %, and a concentration of boron (B) may range from $1\times10^{18}$ to $1\times10^{21}$ atom/cm$^3$.

Figure 15C:
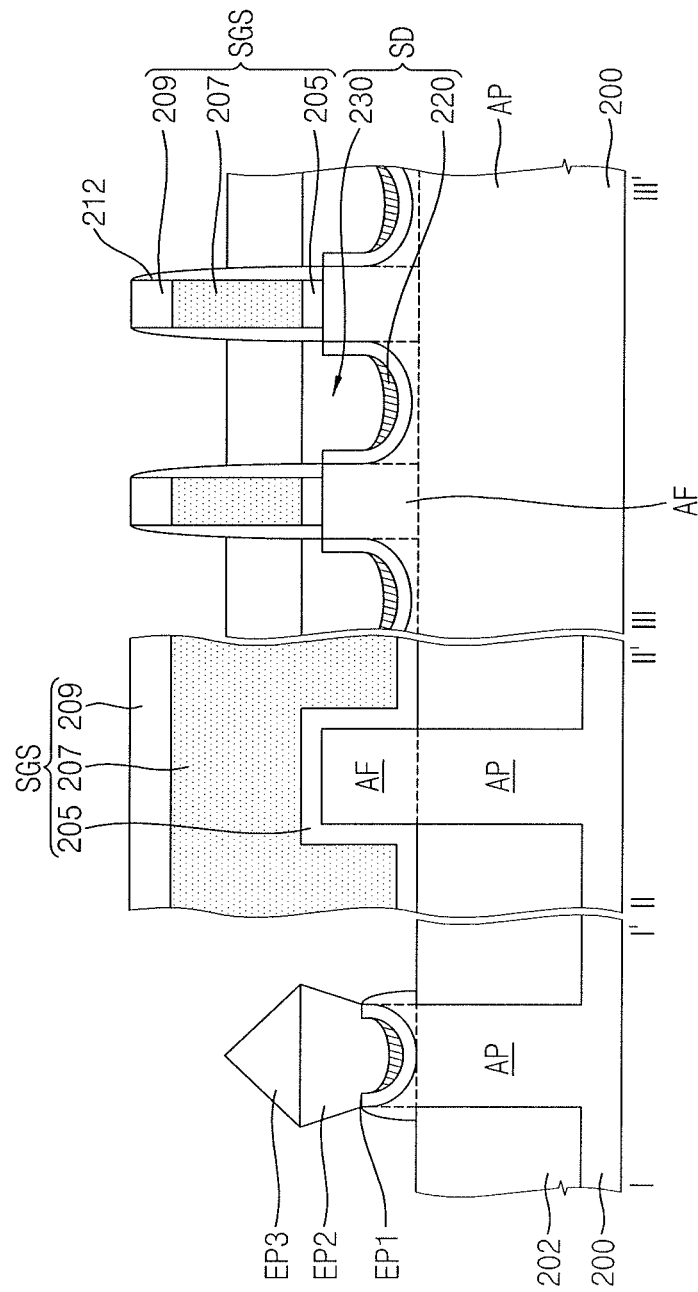

As shown in FIG. 15C, when the bottom surfaces of the recessed regions 216 are located at a higher level than the interface L1 between the active pattern AP and active fin AF, a concentration of an impurity with which the high concentration doped layer 220 is doped may be adjusted. In this case, the concentration of the impurity with which the high concentration doped layer 220 shown in FIG. 15C is doped may be lower than the concentration of the impurity with which the high concentration doped layer 220 shown in FIG. 15B is doped.

Figure 15D:
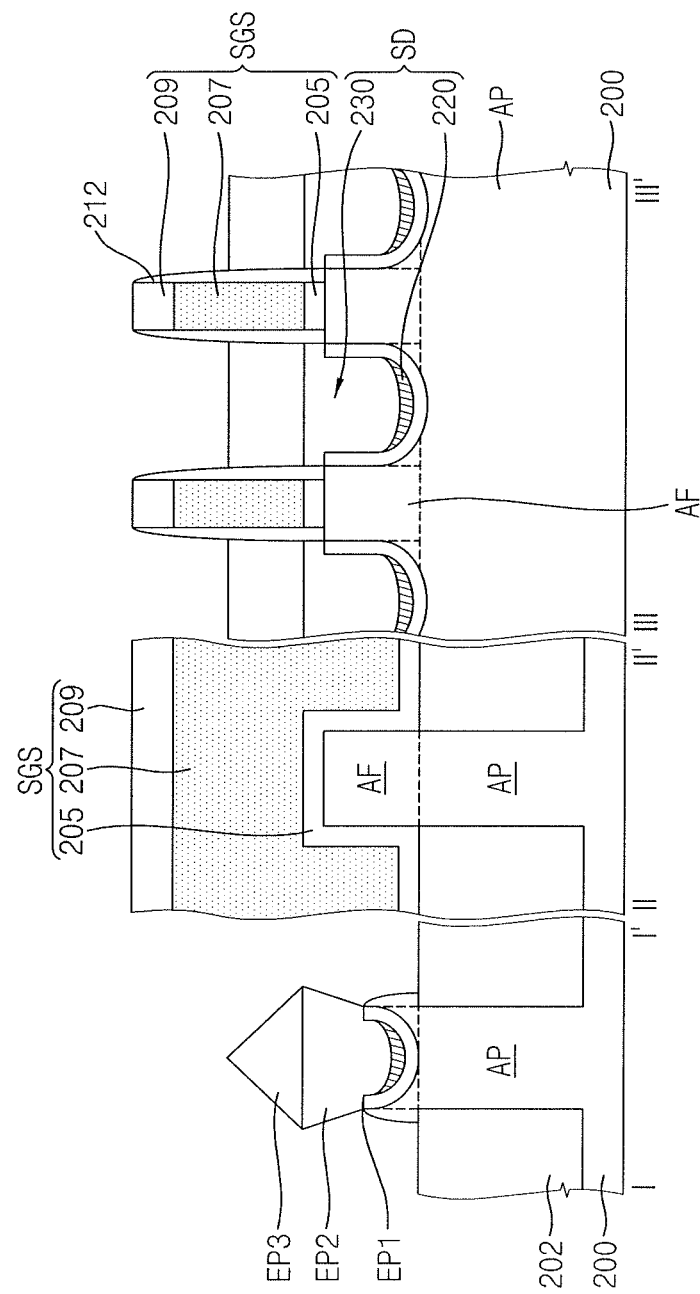
Figure 16:
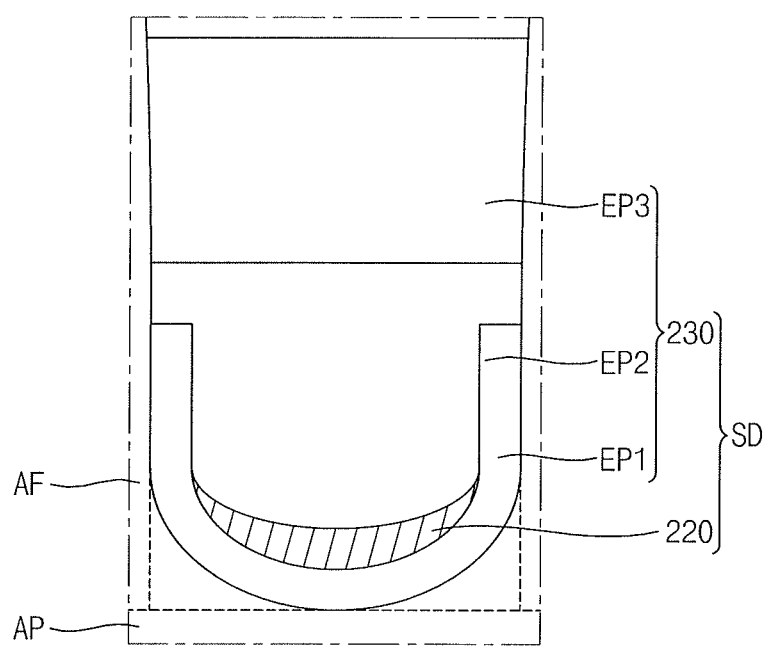

As shown in FIG. 15D, when the bottom surfaces of the recessed regions 216 are located at a lower level than the interface L1 between the active pattern AP and active fin AF, the concentration of the impurity with which the high concentration doped layer 220 is doped may be adjusted. In this case, the concentration of the impurity with which the high concentration doped layer 220 shown in FIG. 15D is doped may be higher than the concentration of the impurity with which the high concentration doped layer 220 shown in FIG. 15B is doped.

The second epitaxial layer EP2 may cover the high concentration doped layer 220 and the third epitaxial layer EP3 may be formed on the second epitaxial layer EP2. Each of the second and third epitaxial layers EP2 and EP3 may include a silicon-germanium layer. A germanium concentration of each of the second and third epitaxial layers EP2 and EP3 may be greater than a germanium concentration of the first epitaxial layer EP1.

The second epitaxial layer EP2 may be formed as an epitaxial layer including a high concentration semiconductor material. The second epitaxial layer EP2 may be doped with a high concentration second conductivity type impurity by an in-situ method. For example, the second epitaxial layer EP2 may be formed as a silicon-germanium layer which is doped with boron by an in-situ method. In this case, a germanium concentration of the second epitaxial layer EP2 may range from 30 to 70 atom %, and a concentration of boron with which the second epitaxial layer EP2 is doped may be $1\times10^{21}$ atom/cm$^3$ or higher. The second epitaxial layer EP2 may be formed by performing a second selective epitaxial growth process using the first epitaxial layer EP1 and the high concentration doped layer 220 as seed layers. The second selective epitaxial growth process may be performed under a pressure condition that is lower than that in the first selective epitaxial growth process. For example, the second selective epitaxial growth process may be performed under a pressure condition of 10 Torr to 30 Torr. As a result, the bottom of the second epitaxial layer EP2 may be formed to have a second thickness greater than that of the bottom of the first epitaxial layer EP1. A side surface of the second epitaxial layer EP2 may be formed to have a thickness greater than that of the side surface of the first epitaxial layer EP1.

Subsequently, the third epitaxial layer EP3 may be formed as an epitaxial layer including a high concentration semiconductor material, and may be doped with a second conductivity type impurity having a concentration which is higher than that of the first epitaxial layer EP1 and lower than that of the second epitaxial layer EP2. For example, the third epitaxial layer EP3 may be formed as a silicon-germanium layer which is doped with boron by an in-situ method. In this case, a germanium concentration of the third epitaxial layer EP3 may range from 30 to 70 atom %, and a concentration of boron with which the third epitaxial layer EP3 is doped may range from $1\times10^{20}$ to $1\times10^{21}$ atom/cm$^3$. The third epitaxial layer EP3 may be formed by performing a third selective epitaxial growth process using the second epitaxial layer EP2 as a seed layer. The third selective epitaxial growth process may be performed under a pressure condition of 10 Torr to 100 Torr.

The first to third selective epitaxial growth processes described above may be consecutively performed in the same chamber. Correspondingly, the high concentration doped layer 220 and the source/drain epitaxial layer 230 may be disposed inside the recessed regions 216 to form the source/drain SD. For example, a source may be formed at one side of the source/drain SD with the gate electrode 240 interposed therebetween and a drain may be formed at the other side thereof.

According to the example embodiment, the high concentration doped layer 220 may be disposed inside the recessed region 216, and the source/drain region SD having a U-shaped cross section may be electrically formed by adjusting a concentration of an impurity with which the high concentration doped layer 220 is doped. For example, lengths of electrical channels between the top and bottom regions of the source/drain region SD may be uniform by disposing the high concentration doped layer 220 inside the recessed region 216. Further, the first epitaxial layer EP1 may be disposed below the high concentration doped layer 220, and the second and third epitaxial layers EP2 and EP3 may be disposed above the high concentration doped layer 220. A concentration of an impurity with which each of the first to third epitaxial layers EP1 to EP3 are doped may be adjusted. Accordingly, the lengths of the channels between the top and bottom regions of the source/drain region SD may be uniform. The electrical characteristics of the semiconductor device may be improved by electrically realizing a U-shaped junction profile.

Figure 17:
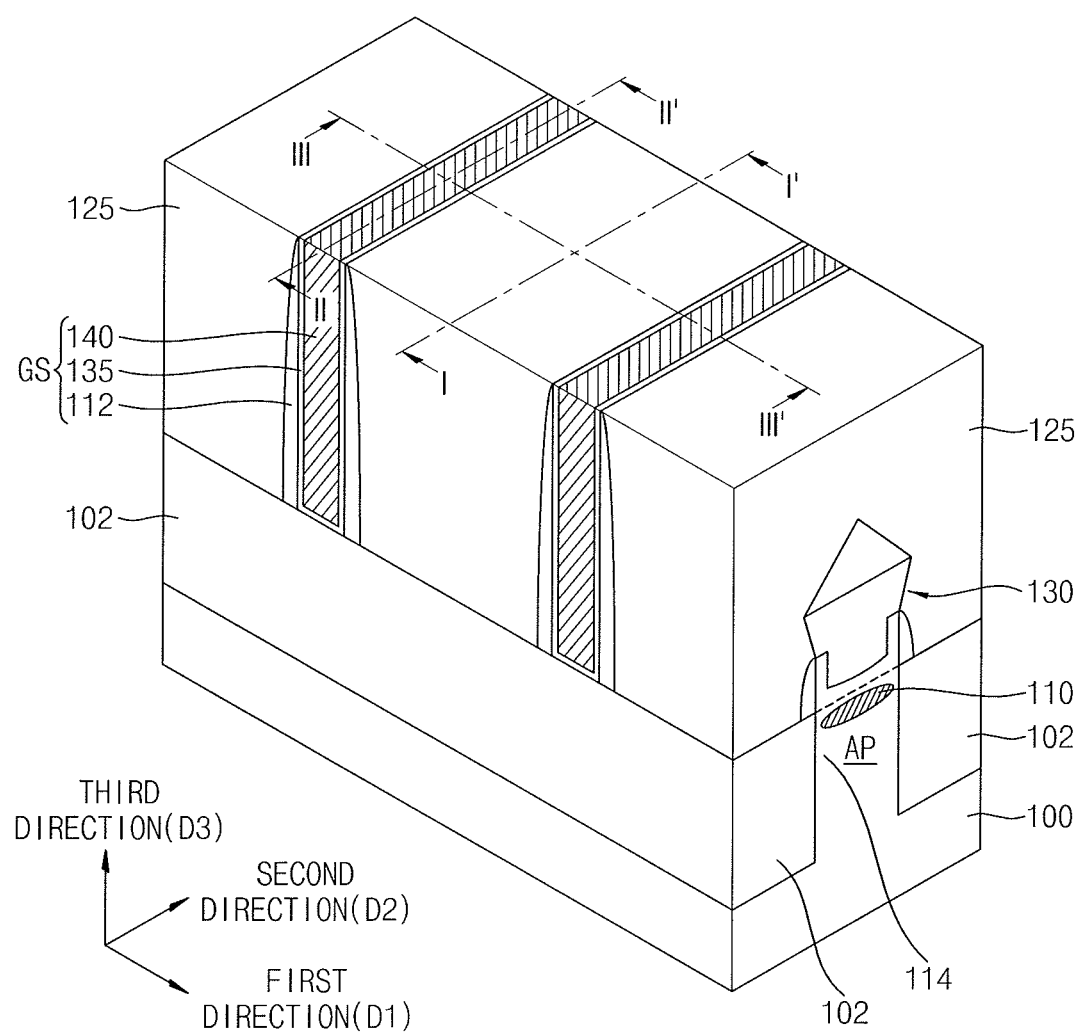
FIG. 17 illustrates a perspective view showing a structure of a FinFET according to an example embodiment.
Figure 18:
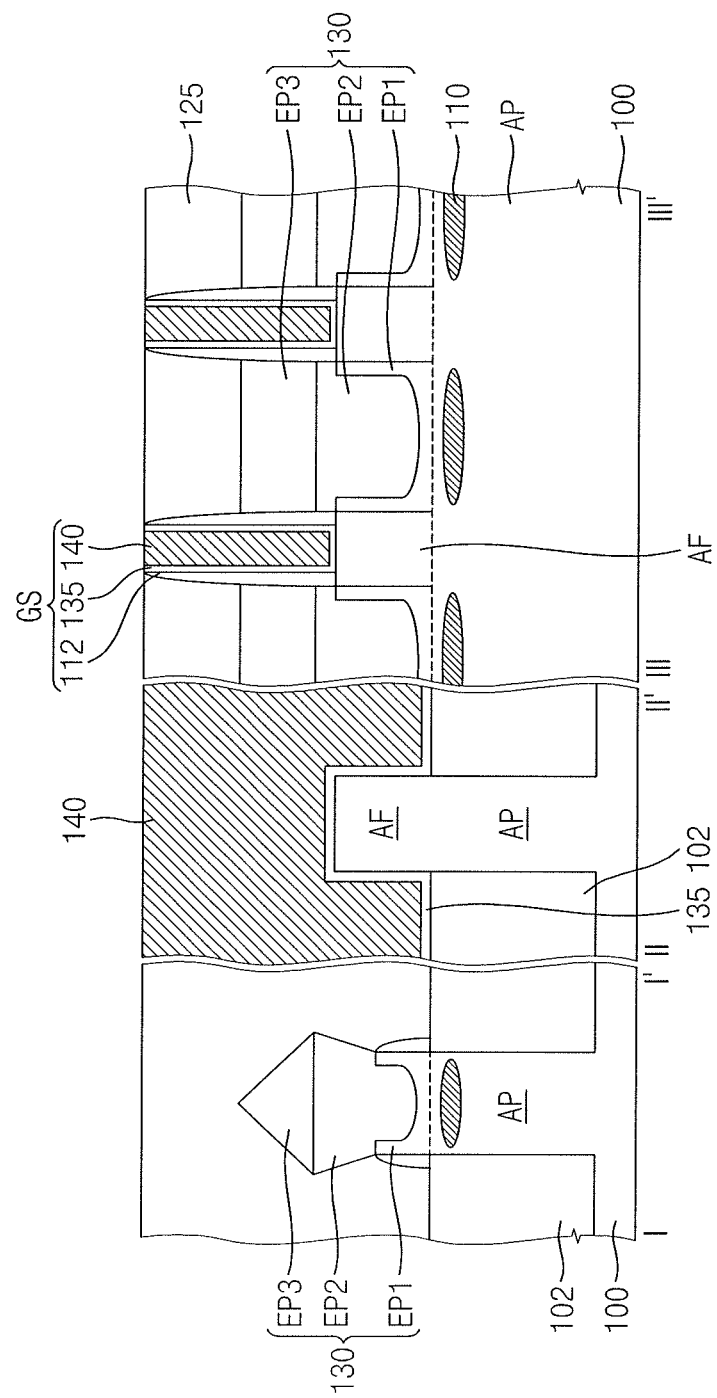
FIG. 18 illustrates a cross-sectional view taken along lines I-I', II-II', and III-III' of FIG. 17.

FIG. 17 illustrates a perspective view showing a structure of a FinFET according to an example embodiment. FIG. 18 illustrates a cross-sectional view taken along lines I-I', II-II', and III-III' of FIG. 17.

Referring to FIGS. 17 and 18, a semiconductor device including the FinFET according to the example embodiment may include a substrate 100, an active pattern AP formed on the substrate 100, a gate structure GS in which a gate electrode 140 is formed, a source/drain region SD, and an implant doped layer 110.

Device isolation patterns 102 may be disposed at both sides of the active pattern AP. The device isolation patterns 102 may be disposed to surround sidewalls of the active pattern AP and may separate active patterns AP of FinFETs from each other. An upper portion of the active pattern AP, which is exposed by the device isolation patterns 102, may be defined as an active fin AF. The active fin AF may be locally disposed below the gate structure GS.

The gate structure GS may include the gate electrode 140, a gate dielectric pattern 135, and gate spacers 112. The gate electrode 140 may be disposed to cross the active pattern AP. The gate spacers 112 may be disposed on both sidewalls of the gate electrode 140. The gate dielectric pattern 135 may be disposed between the gate spacer 112 and gate electrode 140. A plurality of gate structures GS may be provided, and the plurality of gate structures GS may cross at least one active pattern AP. For example, a pair of gate structures GS may be spaced apart from each other in a first direction D1 and may extend in a second direction D2 to cross one active pattern AP.

Recessed regions 116 (see FIGS. 19A and 19B) may be formed on the active patterns AP provided at both sides of the gate structures GS adjacent to each other. For example, the recessed region 116 may be formed between the plurality of gate structures GS. In the drawings, the recessed region 116 is shown as being formed between two gate structures GS adjacent to each other. Here, the recessed region 116 may be defined in a space between the active fins AF which are locally disposed below the gate structures GS. The recessed region 116 may be formed to have a U shape which is tapered downwardly.

As a semiconductor device is scaled down, a recessed region may be deeply formed. It is possible that a recessed region may not have a uniform U-shape due to the limitation of a manufacturing process, and the recessed region has a shape which is tapered downwardly. As a result, a width of a source/drain channel may be determined according to a profile of the recessed region. The width of the source/drain channel in a bottom region of such a recessed region may be wider than that of the source/drain channel in a top region of the recessed region. Therefore, an undesirable deviation could occur in lengths of channels, and the efficiency of the semiconductor device may be lowered.

The implant doped layer 110 may be below the recessed region 116 (e.g., in the active pattern AP and proximate to the substrate 100), and a source/drain epitaxial layer 130 may be disposed inside the recessed region 116. The active pattern AP may be doped with a first conductivity type impurity in an implant manner to form the implant doped layer 110. The active pattern AP may be doped with at least one of phosphorous (P), carbon (C), boron (B), tin (Sn), gallium (Ga), and arsenic (As) at a high concentration to form the implant doped layer 110. The active pattern AP may be doped with Carbon (C) along with another dopant. When the active pattern AP is doped with boron (B), a concentration of an impurity may range from $1 \times 10^{18}$ to $1 \times 10^{21}$ atom/cm$^3$. Further, when the active pattern AP is doped with carbon (C), tin (Sn), gallium (Ga), or arsenic (As), a concentration of an impurity may range from $1 \times 10^{18}$ to $1 \times 10^{21}$ atom/cm$^3$.

The implant doped layer 110 may be formed in the active pattern AP so that the implant doped layer 110 is not in contact with a sidewall of the recessed region 116. The source/drain epitaxial layer 130 may be disposed above the implant doped layer 110. The implant doped layer 110 may be disposed below the recessed region 116 so that lengths of source/drain channels in the top region and the bottom region are uniform. For example, although a deviation may occur in physical widths of the channels between the top region and the bottom region, a deviation of widths of the electrical channels between the top region and the bottom region may be reduced or eliminated by applying the implant doped layer 110 thereto.

The source/drain epitaxial layer 130 may be disposed on the recessed region 116. The source/drain epitaxial layer 130 may be disposed above the implant doped layer 110. The source/drain epitaxial layer 130 may cover the sidewall of the recessed region 116. The source/drain epitaxial layer 130 may have a structure in which a plurality of epitaxial layers EP1 to EP3 is sequentially stacked. The plurality of epitaxial layers EP1 to EP3 may include a semiconductor material having a lattice constant that is different from that of the substrate 100, and may be doped with a second conductivity type impurity different from a first conductivity type impurity.

The source/drain epitaxial layer 130 and the implant doped layer 110 described above may constitute a source/drain region SD of a three-dimensional FinFET. A semiconductor device including the implant doped layer 110 and the source/drain epitaxial layer 130 may be a PMOS transistor. As the source/drain epitaxial layer 130 includes a material (e.g., silicon germanium) having a lattice constant greater than that of the substrate 100, a compressive force may be provided to the active fin AF. As a result, the mobility of electrons, which are major carriers, may be improved in a channel region of the PMOS transistor. In an implementation, the semiconductor device including the implant doped layer 110 and the source/drain epitaxial layer 130 may be an NMOS transistor. In this case, impurities with which the implant doped layer 110 and the source/drain epitaxial layer 130 are doped may be different.

FIGS. 19A to 20B illustrate stages in a method of manufacturing a semiconductor device according to an example embodiment.

Figure 19A:
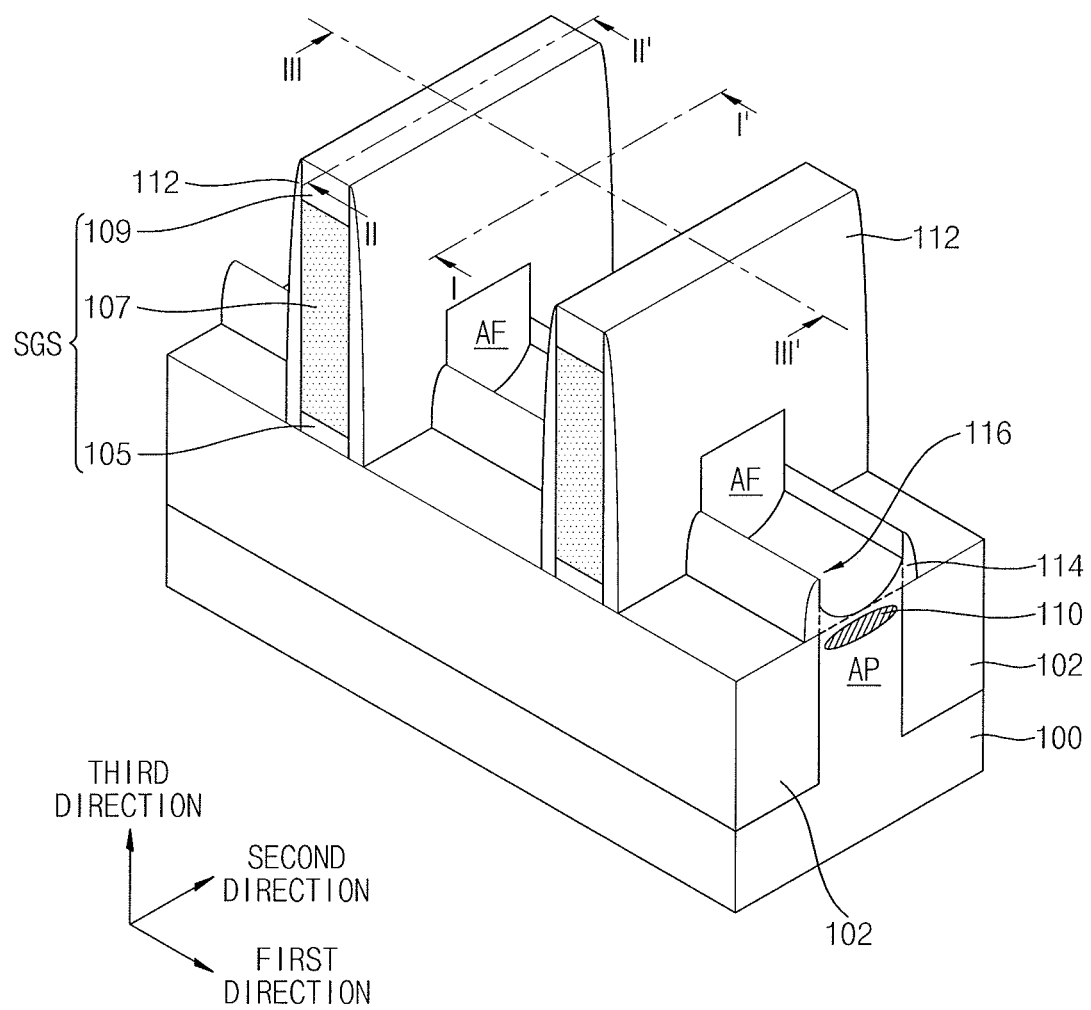
FIGS. 19A to 20B illustrate stages in a method of manufacturing a semiconductor device according to an example embodiment.
Figure 19B:
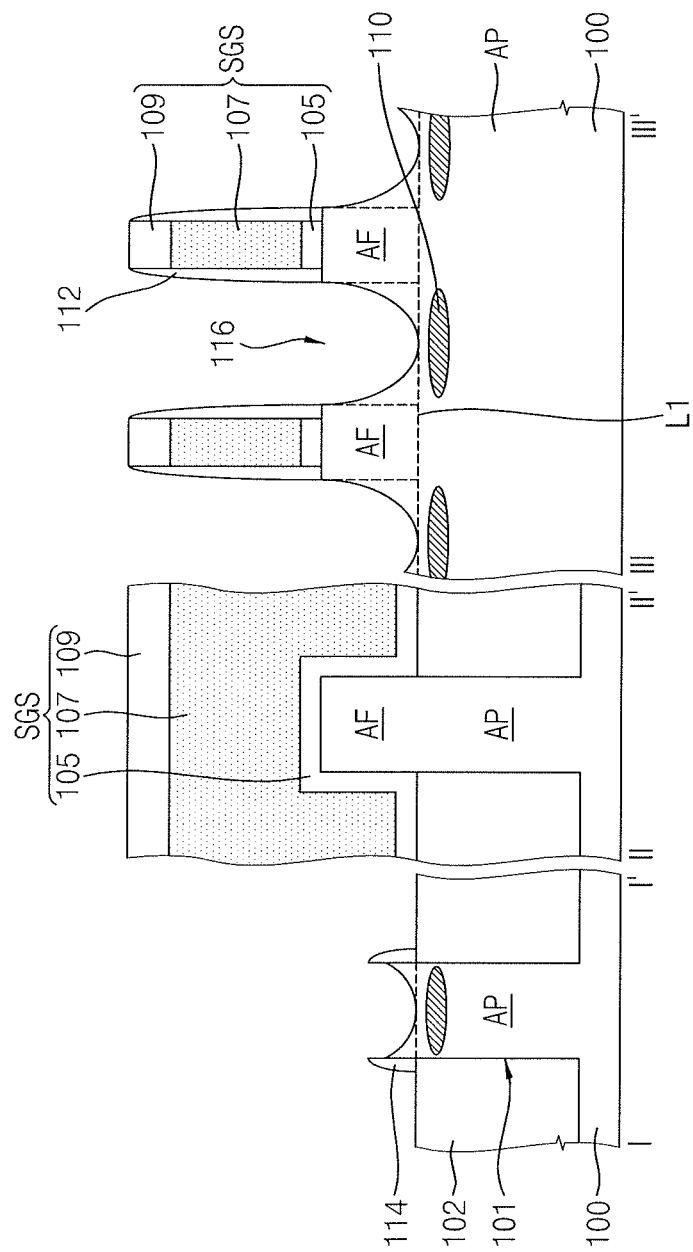

Referring to FIGS. 19A and 19B, portions of active patterns AP formed at both sides of a sacrificial gate structure SGS may be removed so that recessed regions 116 may be formed. Second regions R2 of an active fin AF may be removed by performing an etching process using a gate mask pattern 109 and gate spacers 112 as etch masks, and thus the recessed regions 116 may be formed.

In an implementation, the recessed regions 116 may be formed by sequentially performing an anisotropic etching process and an isotropic etching process. Accordingly, the second regions R2 may be etched in a depth direction by an anisotropic etching process and may be laterally etched toward the active fin AF by an isotropic etching process. A lower portion of the recessed region 116 may have a shape which is tapered downwardly. For example, the recessed region 116 may be formed to have a U-shape (e.g., in cross section) in which a width of a lower portion thereof is narrow.

In order to uniformly form lengths of channels between top and bottom regions of the recessed region 116, an implant doped layer 110 may be disposed below the recessed region 116. After the recessed region 116 is formed, the active pattern AP may be doped with a first conductivity type impurity in an implant manner to form the implant doped layer 110.

For example, the active pattern AP may be doped with at least one of phosphorus (P), carbon (C), boron (B), tin (Sn), gallium (Ga), and arsenic (As) at a high concentration to form the implant doped layer 110. Carbon (C) may be doped along with another dopant. When the active pattern AP is doped with boron (B), a concentration of an impurity may range from $1 \times 10^{18}$ to $1 \times 10^{21}$ atom/cm$^3$. Further, when the active pattern AP is doped with carbon (C), tin (Sn), gallium (Ga), or arsenic (As), a concentration of an impurity may range from $1 \times 10^{18}$ to $1 \times 10^{21}$ atom/cm$^3$.

The implant doped layer 110 may be formed in the active pattern AP so that the implant doped layer 110 is not in contact with a sidewall of the recessed region 116. A source/drain epitaxial layer 130 may be disposed above the implant doped layer 110. The implant doped layer 110 may be disposed below the recessed region 116 so that lengths of source/drain channels in the top region and the bottom region are uniform. For example, a deviation of lengths of the electrical channels between the top region and the bottom region may be reduced by applying the implant doped layer 110 thereto.

Figure 20A:
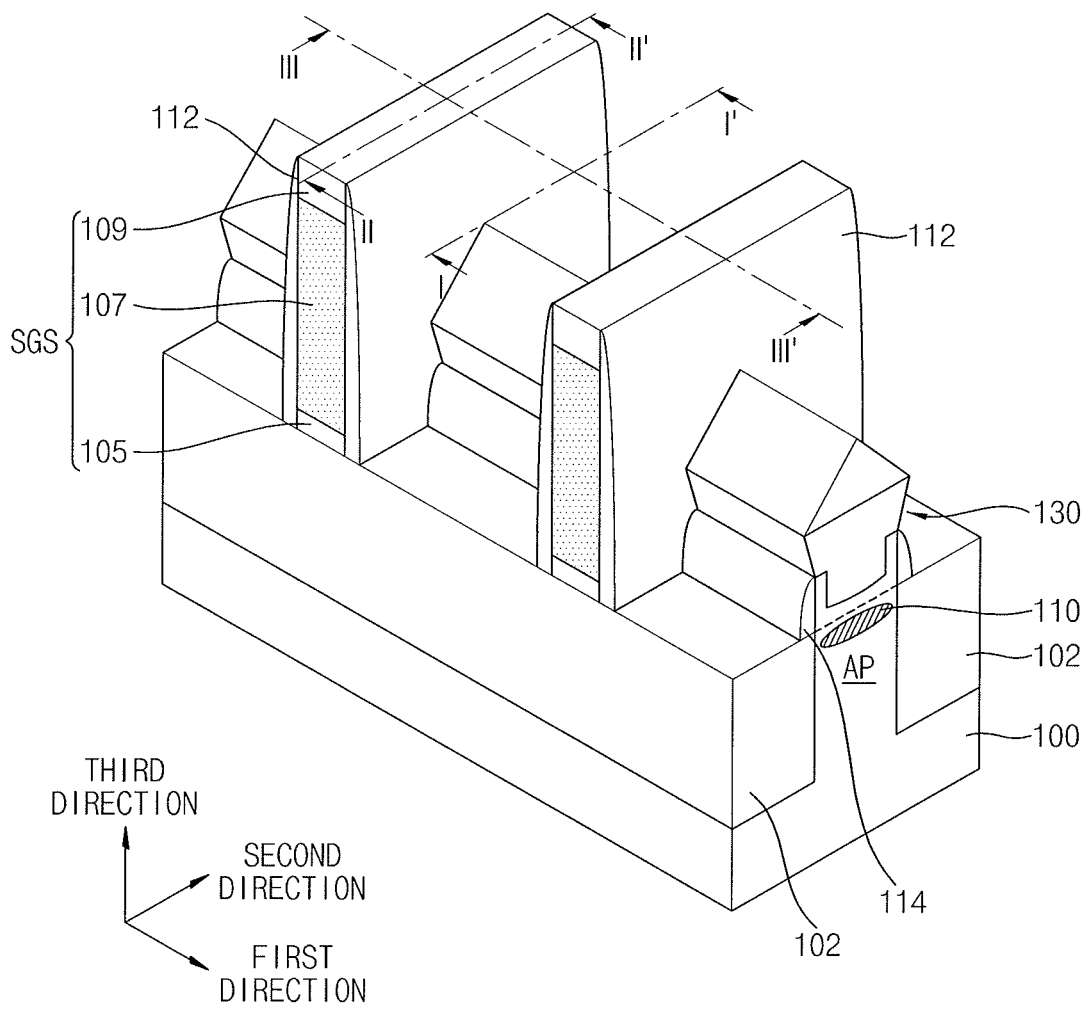
Figure 20B:
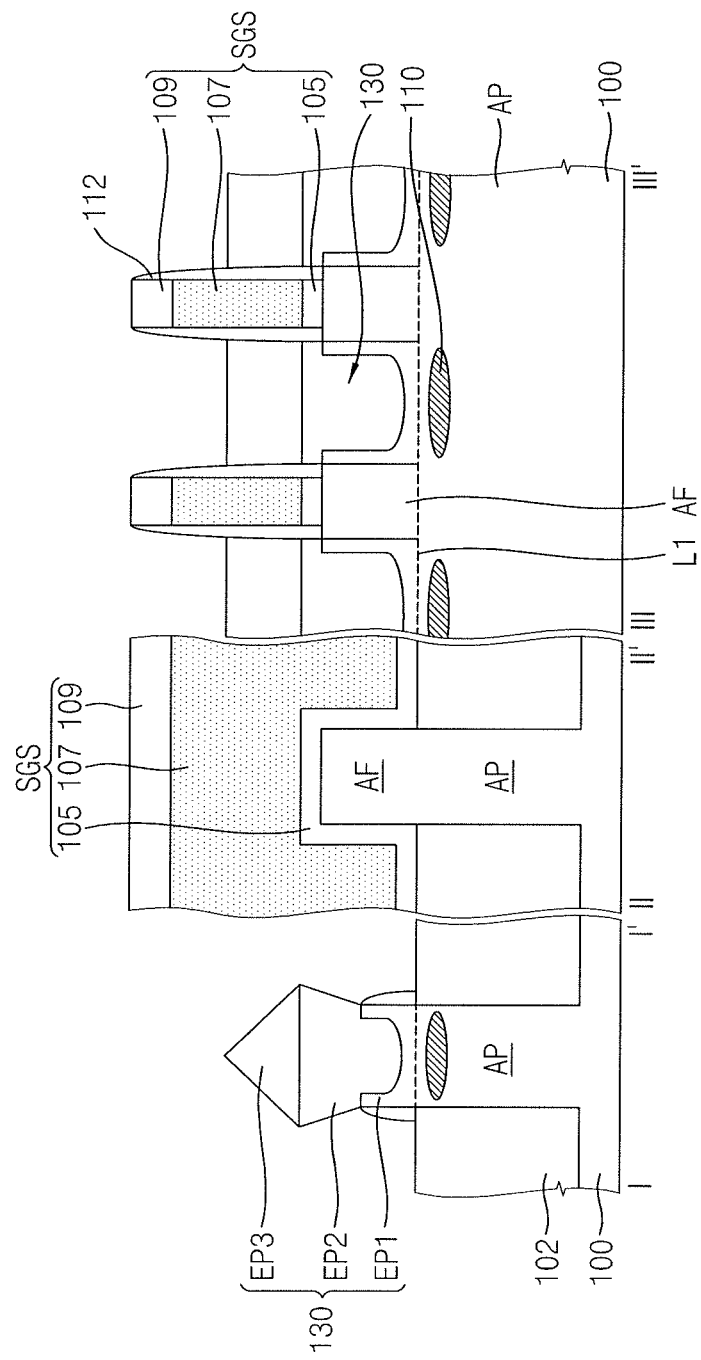

Referring to FIGS. 20A and 20B, the source/drain epitaxial layer 130 may be formed on the recessed region 116. The source/drain epitaxial layer 130 may be disposed above the implant doped layer 110. The source/drain epitaxial layer 130 may have a structure in which a plurality of epitaxial layers EP1 to EP3 are sequentially stacked. The plurality of epitaxial layers EP1 to EP3 may include a semiconductor material having a lattice constant different from that of the substrate 100, and may be doped with a second conductivity type impurity different from a first conductivity type impurity. The source/drain epitaxial layer 130 may be formed above the implant doped layer 110 by performing a selective epitaxial growth process using the active pattern AP exposed by the recessed region 116 as a seed layer. First to third selective epitaxial growth processes may be consecutively performed in the same chamber. The implant doped layer 110 and the source/drain epitaxial layer 130 described above may constitute a source/drain region SD of a three-dimensional FinFET.

According to the example embodiment, the implant doped layer 110 may be disposed below the recessed region 116, and the source/drain region SD having a U-shaped cross section may be electrically formed by adjusting a concentration of an impurity with which the implant doped layer 110 is doped. For example, the lengths of the electrical channels between the top and bottom regions of the source/drain region SD may be constantly formed by disposing the implant doped layer 110 below the recessed region 116. Further, the source/drain epitaxial layer 130 may be disposed above the implant doped layer 110, and a concentration of an impurity with which the source/drain epitaxial layer 130 is doped may be adjusted. The lengths of the channels between the top and bottom regions of the source/drain region SD may be uniform. Accordingly, the electrical characteristics of the semiconductor device may be improved by electrically realizing a U-shaped junction profile.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, in order to increase the degree of integration of a semiconductor device, a length of a channel between a source and a drain of a transistor may be shortened, a thickness of an insulator may be reduced, and thus a leakage current may be increased. In addition, an effective area of a gate for controlling a flow of a current between the source and the drain may be reduced. In a fin field-effect transistor (FinFET), a length of a channel between a source and a drain thereof may be increased, and an effective area of a gate may be increased.

The embodiments may provide a semiconductor device including a fin field-effect transistor for reducing a deviation in length of channels between a fin top channel region and a fin bottom channel region.

The embodiments may provide a semiconductor device including a fin field-effect transistor for lowering a channel resistance (Rch) and a source-drain resistance (Rsd) of a fin bottom channel.

The semiconductor devices according to the example embodiments may be applied to a complementary metal-oxide-semiconductor static random-access memory (CMOS SRAM) cell. In an implementation, the semiconductor devices may be applied to a dynamic random access memory (DRAM), a magnetoresistive random access memory (MRAM), or another semiconductor device and a method of manufacturing the same.

According to the embodiments, in a semiconductor device including a FinFET and a method of manufacturing the same, a channel defect may be prevented by reducing a deviation in length of channels between a fin top channel region and a fin bottom channel region.

According to the embodiments, in a semiconductor device including a FinFET and a method of manufacturing the same, the performance of the semiconductor device may be improved by lowering a channel resistance (Rch) and a source-drain resistance (Rsd) of a fin bottom channel.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
an active pattern protruding from a substrate;
a plurality of gate structures each including a gate electrode and crossing the active pattern; and
a source/drain region between the plurality of gate structures,
wherein:
the source/drain region includes:
a high concentration doped layer in contact with a bottom surface of a recessed region in the active pattern,
a first epitaxial layer in contact with an upper surface of the high concentration doped layer and a sidewall of the recessed region, and
a second epitaxial layer on the first epitaxial layer, and
the high concentration doped layer has a first area in contact with the bottom surface of the recessed region and a second area in contact with the sidewall of the recessed region, the first area being wider than the second area.

2. The semiconductor device as claimed in claim 1, wherein:
the semiconductor device includes electrical channels between a top region and a bottom region of the source/drain region, the electrical channels having lengths, and
the lengths of the electrical channels between the top region and the bottom region of the source/drain region are uniform.

3. The semiconductor device as claimed in claim 1, wherein the high concentration doped layer includes a doped silicon-germanium layer, the silicon-germanium layer being formed by growing silicon germanium in an epitaxial manner, and the silicon-germanium layer being doped with boron, carbon, tin, gallium, or arsenic.

4. The semiconductor device as claimed in claim 3, wherein a concentration of boron, carbon, tin, gallium, or arsenic with which the silicon-germanium layer is doped ranges from $1 \times 10^{18}$ to $1 \times 10^{21}$ atom/cm$^3$.

5. The semiconductor device as claimed in claim 1, wherein the first epitaxial layer, the second epitaxial layer, and a third epitaxial layer include identical impurities, and concentrations of the impurities are different.

6. The semiconductor device as claimed in claim 5, wherein:
the first epitaxial layer, the second epitaxial layer, and the third epitaxial layer each include germanium,
a concentration of germanium in the first epitaxial layer ranges from 10 to 30 atom %; and
a concentration of germanium in each of the second epitaxial layer and the third epitaxial layer ranges from 30 to 70 atom %.

7. The semiconductor device as claimed in claim 5, wherein the first epitaxial layer, the second epitaxial layer, and the third epitaxial layer include a silicon-germanium layer doped with boron.

8. The semiconductor device as claimed in claim 5, wherein:
the concentration of the impurity in the second epitaxial layer is higher than that of the first epitaxial layer; and
the concentration of the impurity in the third epitaxial layer is lower than that of the second epitaxial layer.

9. A semiconductor device, comprising:
an active pattern protruding from a substrate;
a plurality of gate structures each including a gate electrode and crossing the active pattern; and
a source/drain region between the plurality of gate structures,
wherein:
the source/drain region includes:
a first epitaxial layer in contact with a bottom surface and a sidewall of a recessed region in the active pattern,
a high concentration doped layer in contact with an upper surface of a bottom end of the first epitaxial layer, and
a second epitaxial layer covering the high concentration doped layer and the first epitaxial layer,
the high concentration doped layer has a first area in contact with the upper surface of the bottom of the first epitaxial layer and a second area in contact with a sidewall of the first epitaxial layer, the first area being wider than the second area, and
the high concentration doped layer is spaced apart from a top region of the sidewall of the first epitaxial layer.

10. The semiconductor device as claimed in claim 9, wherein:
the semiconductor device includes electrical channels between a top region and a bottom region of the source/drain region, the electrical channels having lengths, and
the lengths of the electrical channels between the top region and the bottom region of the source/drain region are uniform.

11. The semiconductor device as claimed in claim 9, wherein the high concentration doped layer includes a doped silicon-germanium layer, the silicon-germanium layer being formed by growing silicon germanium in an epitaxial manner, and the silicon-germanium layer being doped with boron, carbon, tin, gallium, or arsenic.

12. The semiconductor device as claimed in claim 11, wherein a concentration of boron, carbon, tin, gallium, or arsenic with which the silicon-germanium layer is doped ranges from $1 \times 10^{18}$ to $1 \times 10^{21}$ atom/cm$^3$.

13. The semiconductor device as claimed in claim 9, wherein the first epitaxial layer, the second epitaxial layer, and a third epitaxial layer include identical impurities, and concentrations of the impurities are different.

14. The semiconductor device as claimed in claim 13, wherein:
the first epitaxial layer, the second epitaxial layer, and the third epitaxial layer each include germanium,
a concentration of germanium in the first epitaxial layer ranges from 10 to 30 atom %; and
a concentration of germanium in each of the second epitaxial layer and the third epitaxial layer ranges from 30 to 70 atom %.

15. The semiconductor device as claimed in claim 13, wherein the first epitaxial layer includes a silicon-germanium layer doped with boron.

16. The semiconductor device as claimed in claim 13, wherein:
the concentration of the impurity in the second epitaxial layer is higher than that of the first epitaxial layer; and
the concentration of the impurity in the third epitaxial layer is lower than that of the second epitaxial layer.

17. A semiconductor device, comprising:
an active pattern protruding from a substrate;
a plurality of gate structures each including a gate electrode and crossing the active pattern; and
a source/drain region between the plurality of gate structures,
wherein the source/drain region includes:
an implant doped layer below a recessed region in the active pattern,
a first epitaxial layer in the recessed region, and
a second epitaxial layer on the first epitaxial layer, and
wherein the implant doped layer is spaced apart from a sidewall of the recessed region.

18. The semiconductor device as claimed in claim 17, wherein:
the semiconductor device includes electrical channels between a top region and a bottom region of the source/drain region, the electrical channels having lengths, and
the lengths of the electrical channels between the top region and the bottom region of the source/drain region are uniform.

19. The semiconductor device as claimed in claim 17, wherein the implant doped layer is formed in the active pattern, is disposed below the recessed region, and is doped with boron, carbon, tin, gallium, or arsenic.

* * * * *